United States Patent [19]
Eida et al.

[11] Patent Number: 5,909,081
[45] Date of Patent: Jun. 1, 1999

[54] MULTI-COLOR LIGHT EMISSION APPARATUS WITH ORGANIC ELECTROLUMINESCENT DEVICE

[75] Inventors: Mitsuru Eida; Masahide Matsuura; Hiroshi Tokailin, all of Sodegaura, Japan

[73] Assignee: Idemitsu Kosan Co., Ltd., Tokyo, Japan

[21] Appl. No.: 08/875,756

[22] PCT Filed: Feb. 5, 1996

[86] PCT No.: PCT/JP96/00233

§ 371 Date: Aug. 6, 1997

§ 102(e) Date: Aug. 6, 1997

[87] PCT Pub. No.: WO96/25020

PCT Pub. Date: Aug. 15, 1996

[30] Foreign Application Priority Data

Feb. 6, 1995 [JP] Japan .................................... 7-041267
Feb. 14, 1995 [JP] Japan .................................... 7-049089
Oct. 24, 1995 [JP] Japan .................................... 7-299111

[51] Int. Cl.$^6$ ............................ H05B 33/04; H05B 33/14

[52] U.S. Cl. .......................... 313/504; 313/506; 313/512; 345/76; 315/169.3; 428/917

[58] Field of Search .................................... 313/504, 501, 313/506, 509, 512; 428/917; 345/76, 36, 45; 315/169.3; 257/40

[56] References Cited

U.S. PATENT DOCUMENTS 5,294,870  3/1994  Tang et al. .............................. 313/504
5,693,956  12/1997  Shi et al. .................................. 257/40

Primary Examiner—Sandra O'Shea
Assistant Examiner—Michael Day
Attorney, Agent, or Firm—Oblon, Spivak, McClelland, Maier & Neustadt, P.C.

[57] ABSTRACT

This invention provides a multi-color light emission apparatus wherein a transparent inorganic oxide substrate (4) is disposed between an organic EL device (1) and a fluorescent layer (3) in such a manner as to arrange the fluorescent layer (3) with a gap with the organic EL device (1), and the organic EL device (1) is sealed by sealing means (5) between the transparent inorganic oxide substrate (4) and a support substrate (2). The invention provides also a multi-color light emission apparatus wherein a transparent insulating inorganic oxide layer (12) having a thickness of 0.01 to 200 μm is interposed between the fluorescent layer (3) and the organic EL device (1). In this way, light emission life and angle-of-view characteristics can be improved.

10 Claims, 6 Drawing Sheets

MULTI-COLOR LIGHT EMISSION APPARATUS WITH ORGANIC ELECTROLUMINESCENT DEVICE

FIELD OF THE INVENTION

This invention relates to a multi-color light emission apparatus and a method for producing thereof. More specifically, this invention relates to a multi-color light emission apparatus suitable for use in multi-color or full-color thin-type displays and a method for producing the multi-color light emission apparatus.

DESCRIPTION OF THE BACKGROUND ART

An electroluminescence device (hereinafter called "EL device") is characterized in exhibiting high visibility due to self-emission and in having excellent impact resistance because of being completely solid. At present, variable EL devices using an inorganic or an organic compound as the emitting layer are proposed and attempts have been made to put them to practical use. One of the EL devices which has been realized is applied as a multi-color light emission apparatus.

Such a multi-color light emission apparatus includes an apparatus produced by combining a color filter of three primary colors (red, green, and blue) with a white-light emitting inorganic EL device and an apparatus produced by patterning inorganic EL devices of three primary colors in order to position the EL devices of three primary colors separately on the same plane and thereby to emit light (Semicond. Sci. Technol. 6 (1991) 305–323) However, there is the problem that the effect of emitting light of each color is limited to 33% of the white light at most if the white color is resolved by the color filter of three primary colors. Further, EL devices which themselves can efficiently emit white light have still not been attained at present.

On the other hand, a photolithography process is used for patterning EL devices. However, it is known that the efficiency and stability of EL devices are greatly reduced in such a wet process.

It is common knowledge that, among EL devices, organic EL devices are promising as highly intense and efficient light emitting devices. In particular, because the light emitting layer is an organic layer, it is highly probable that various emitting colors are produced by the molecular design of organic compounds. Such an organic EL device is expected to be one device which can be used in practice in a multi-color light emitting apparatus.

However, these organic EL devices have the drawback that chemical factors such as external steam, oxygen, organic compound gas, and the like cause deterioration of the EL devices such as reduction in luminance accompanied by the occurrence of dark spots and the like and these devices tend to be destroyed from physical (mechanical) factors such as heat, impact, or the like since the EL devices are composed of a laminate of low molecular organic compounds.

Therefore, the method for separately disposing each of the organic EL devices, which emit lights of three primary colors (RGB), on the same plane can be used in a wet process or a process including heat treatment such as a photolithography process only with difficulty.

In order to solve such a problem, disclosed is a color EL display apparatus (see Japanese Patent Application Laid-open No. 40888/1989). This apparatus is, as shown in FIG. 8, characterized in that an EL emitting layer 1b sandwiched between a lower electrode 1c and a light transmitting upper electrode 1a is disposed on a substrate 2, the EL light which is output via the light transmitting electrode 1a is externally output from a transmitting substrate 8 via a color filter 9 installed on the transmitting substrate 8, the color filter 9 facing the transmitting electrode 1a.

This apparatus has, however, the disadvantage that the luminance of the light of each color is reduced to one third of the EL light by the color filter. Also, because the EL device faces the color filter, the light emission life of the EL device is invariably reduced by aqueous vapor, oxygen, gas from organic monomers, low molecular components, and the like generated by the color filter.

To solve these problems, lately disclosed is a technique in which a fluorescent layer absorbing light emitted from an organic EL device and emitting visible fluorescent light is installed in the position (laminated or in parallel) corresponding to the emitting portion of the organic EL device (see Japanese Patent Application Laid-open No. 152897/1991). This technique ensures that the light of a blue or blue-green color emitted from the organic EL device is converted into a fluorescent light which is visible light of a longer wave length. This technique is utilized in a multi-color (three primary colors) light emission apparatus in which fluorescent layers capable of converting the blue or blue-green color into a green or red color are separately disposed on a flat plane (see Japanese Patent Application Laid-open No. 258860/1993).

The installation of the fluorescent layer has the advantage that multi-color light emission which is higher in efficiency than in the case of installing a color filter is expected. Specifically, if the fluorescent layer especially for converting into a green color is expected to absorb 80% or more of the blue color light emitted from the organic EL device, a variety of fluorescent materials capable of emitting fluorescent light at an efficiency of 80% or more are known. Assuming both the light absorbing efficiency and light emitting efficiency of the fluorescent layer to be 80%, it is estimated that the blue light of the organic EL device can be converted into visible light with a long wave length at a yield of 64%.

A multi-color light emission apparatus can be realized using an organic EL device and a fluorescent layer in the above manner. Japanese Patent Application Laid-open No. 258860/1993 proposes the following structure for the multi-color light emission apparatus.

As shown in FIG. 15, fluorescent layers 3R, 3G absorbing the light emitted from an organic EL device and emitting a green color and red color respectively are separately disposed on a transparent substrate 11 on the same plane. A polymer and/or cross-linking compound of an organic monomer or oligomer and a transparent insulating rigid plane layer (protective layer) 7 produced by a sol-gel glass method are laminated on the transparent substrate 11 including the fluorescent layers 3R, 3G by spin casting. A transparent electrode 1a of the organic EL device is disposed on the plane layer 7.

Disclosed as other structures are a structure in which the transparent and insulating flat rigid elements is simply placed on the surface of the fluorescent layer instead of being laminating on the fluorescent layer by spin casting and a structure in which the fluorescent layer is affixed to the back face of the hard element exhibiting the functions of a flat plane layer instead of affixing the fluorescent layer to the surface of the substrate. However, it is reported that the structure shown in FIG. 15 is preferable.

The structure shown in FIG. 15, however, has the problem that the light emission life of the organic EL device is reduced by aqueous vapor, oxygen, gas from monomers and the like which are adsorbed to or included in the organic compound of the flat plane layer in a slight amount whereby the emission is indispensably non-uniform, because the transparent electrode of the organic EL device is only disposed on the same flat layer composed of the polymer and/or cross-linking compound of an organic monomer or oligomer.

Also, a high temperature treatment at 400° C. or more is generally required for the production of the flat plane layer in the sol-gel glass method. This causes the deterioration of the organic fluorescent layer. If the sol-gel glass flat plane is produced by heat treatment (up to the maximum temperature of around 250° C.) which never causes the fluorescent member to deteriorate, there is the problem that the light emission life of the organic EL device is greatly reduced for the same reason as above because water or organic compounds remain.

Also, clear explanations about the hard member in the other structures are not necessarily sufficient.

On the other hand, disclosed is a method in which a glass plate with a color filter formed by printing is disposed under the back face of a glass substrate of an inorganic EL device (see Japanese Patent Application Laid-open No. 119494/1982).

However, a reduction in the emitting efficiency caused by the color filter is easily predicted in this method. Also, since the organic EL device is produced independently of the color filter, camber and distortion of the substrate occur so that the EL device cannot be manufactured in a stable manner, if, for example, the thickness of the substrate of the organic EL device is not increased (around 700 $\mu$m or more). As a result of the increase in the thickness of the substrate, the gap between the color filter and the EL device increases, whereby emitted light of a color other than the desired emitted colors leaks to remarkably narrow the angle of view when multi-color light is emitted.

This invention has been achieved in view of this situation and has an object of providing a multi-color light emission apparatus using an organic EL device having superior light emission life and excellent characteristics in the angle of view and a method for manufacturing the multi-color light emission apparatus in a stable and efficient manner.

DISCLOSURE OF THE INVENTION

The above object can be attained in a first invention by the provision of a multi-color light emission apparatus comprising a support substrate, an organic electroluminescence (EL) device disposed on the support substrate, and a fluorescent layer disposed corresponding to a transparent electrode or electrode of the organic EL device to absorb the light emitted from the organic EL device and to emit visible fluorescent light, wherein a transparent inorganic oxide substrate on which a fluorescent layer is placed is disposed between the organic EL device and the fluorescent layer in such a manner as to provide a gap between the fluorescent layer and the organic EL device, and the organic EL device is sealed by a sealing means between the transparent inorganic oxide substrate and the support substrate.

In preferred embodiments, the fluorescent layers are separately disposed on the transparent inorganic oxide substrate on the same plane;

a protective layer of the fluorescent layers and/or a transparent substrate are further disposed on the fluorescent layer;

the plate thickness of the transparent inorganic oxide substrate is in a range of from 1 to 200 $\mu$m; and the transparent inorganic oxide substrate is made of a transparent glass plate.

The above object can be attained in a second invention by the provision of a multi-color light emission apparatus comprising a transparent support substrate, fluorescent layers separately disposed on the transparent support substrate on the same plane, and an organic electroluminescence (EL) device disposed on or above the fluorescent layers, the fluorescent layers being disposed corresponding to a transparent electrode or electrode of the organic EL device so that each of the fluorescent layers absorbs the light emitted from the organic EL device and emits different types of visible fluorescent light, wherein a transparent and insulating inorganic oxide layer with a thickness of from 0.01 to 200 $\mu$m is interposed between the fluorescent layer and the organic EL device.

In preferred embodiments, a transparent protective layer of the fluorescent layers and/or a transparent adhesive layer are disposed between the fluorescent layer and the transparent and insulating inorganic oxide layer;

the transparent and insulating inorganic oxide layer is made of a transparent and insulating glass plate;

the transparent and insulating inorganic oxide layer is made from one or more compounds selected from a group consisting of silicon oxide, aluminum oxide, and titanium oxide; and the transparent and insulating inorganic oxide layer is produced by forming a film of one or more compounds selected from a group consisting of silicon oxide, aluminum oxide, and titanium oxide on at least one of the surface or back face of a transparent and insulating glass plate.

The above object can be attained in a third invention by the provision of a method for manufacturing a multi-color light emission apparatus by separately disposing, on a transparent support substrate, fluorescent layers absorbing the light emitted from an organic EL device and emitting different visible fluorescent light on the same plane and by disposing the organic EL device on or above the fluorescent layer so that a transparent electrode or electrode of the organic EL device corresponds to the fluorescent layer, comprising:

(A) a step of separately disposing the fluorescent layers on the transparent support substrate on the same plane;

(B) a step of disposing a transparent protective layer of the fluorescent layers and/or a transparent adhesive layer on the fluorescent layers and on the transparent support substrate on which the fluorescent layers are separately disposed;

(C) a step of bonding a transparent and insulating glass plate with a thickness of from 1 to 200 $\mu$m, in which a transparent electrode is formed or is to be formed, or bonding a member produced by forming a film made of one or more compounds selected from a group consisting of silicon oxide, aluminum oxide, and titanium oxide on at least one of the surface or back face of a transparent and insulating glass plate, to the transparent protective layer of the fluorescent layers or to a transparent adhesive layer; and (D) a step of laminating an organic compound layer and electrodes of the organic EL device in order on the glass plate in which the transparent electrode is formed.

The first to third inventions can provide a multi-color light emission apparatus using an organic EL device having superior light emission life and excellent characteristics in the angle of view and a method for manufacturing the multi-color light emission apparatus in a stable and efficient manner.

DETAILED DESCRIPTION OF THE INVENTION AND PREFFERED EMBODIMENTS

The multi-color light emitting apparatus of the invention and a method for manufacturing thereof will now be explained in more detail.

The organic EL multi-color light emission apparatus of the present invention must have a structure in which the light (especially a blue color or blue-green color) emitted from an organic EL device is efficiently absorbed by a fluorescent layer, without light reduction and light scattering, and in which a fluorescent light emitted from the fluorescent layer is externally output without light reduction and light scattering.

I. Multi-color Light Emission Apparatus (First invention)

Figure 1:
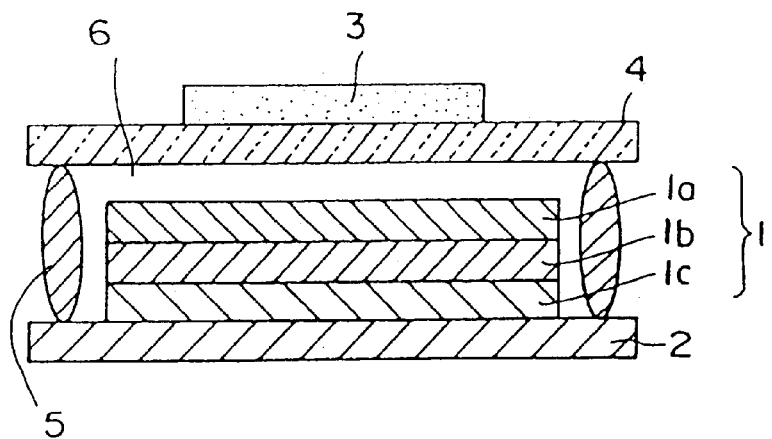
FIG. 1 is a schematic and typical cross section of an embodiment of the multi-color light emission apparatus (first invention) of the present invention.
Figure 2:
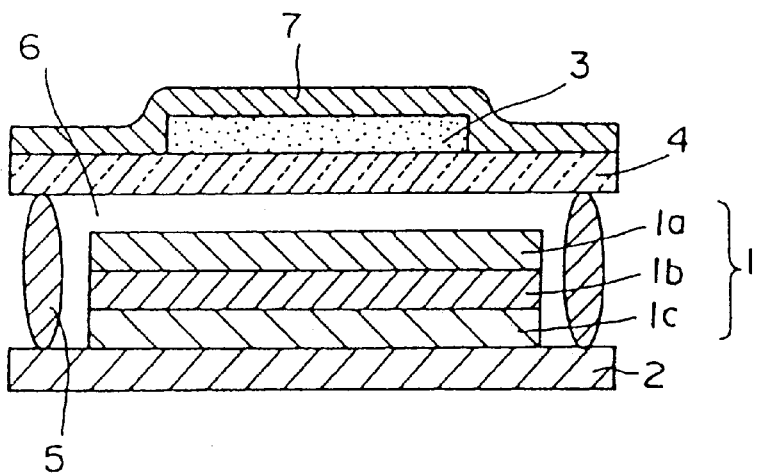
FIG. 2 is a schematic and typical cross section of the multi-color light emission apparatus (first invention) of the present invention showing another embodiment using a protective layer of the fluorescent layers.
Figure 3:
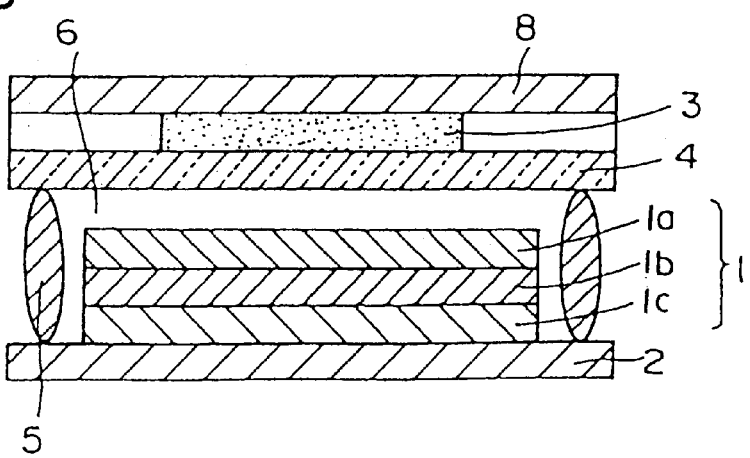
FIG. 3 is a schematic and typical cross section of the multi-color light emission apparatus (first invention) of the present invention showing an example using a transparent substrate.

From the above points of view, the first invention is specifically exemplified by the following structures (1)–(3), which are respectively shown in FIGS. 1–3. Incidentally, a fluorescent layer may convert the light emitted from an organic EL device into light of a wave length longer than that of the light emitted from the organic EL device.

(1) Support substrate 2/organic EL device 1 (electrode 1c/organic compound layer 1b/transparent electrode 1a)/gap 6/transparent inorganic oxide substrate 4/fluorescent layer (2) Support substrate 2/organic EL device 1 (electrode 1c/organic compound layer 1b/transparent electrode 1a/gap 6/transparent inorganic oxide substrate 4/fluorescent layer 3/protective layer 7 of the fluorescent layers)

(3) Support substrate 2/organic EL device 1 (electrode 1c/organic compound layer 1b/transparent electrode 1a/gap 6/transparent inorganic oxide substrate 4/fluorescent layer 3/transparent substrate 8)

In the apparatus of the present invention, the organic EL device 1 is sealed by a sealing means 5 formed by bonding the transparent inorganic oxide substrate 4 to the support substrate 2, for example, using an adhesive.

Figure 4:
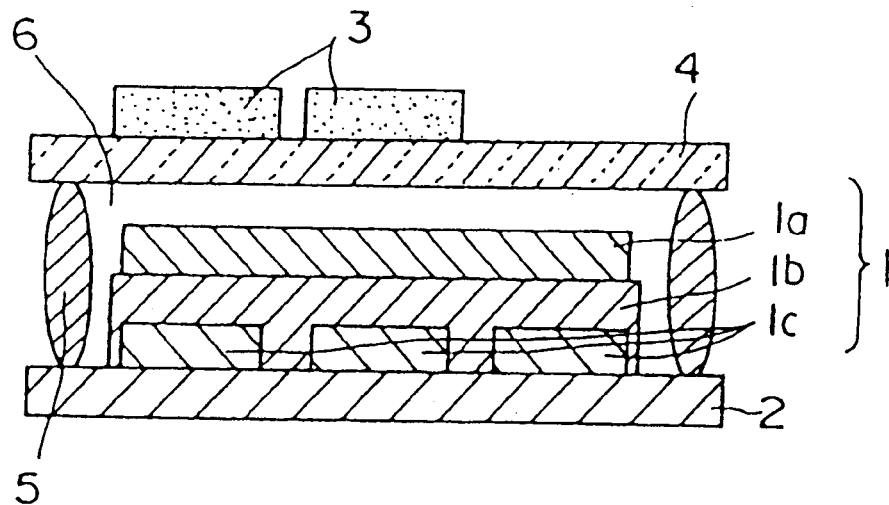
FIG. 4 is a schematic and typical cross section of the multi-color light emission apparatus (first invention) of the present invention showing a further embodiment using a fluorescent layer separately disposed.
Figure 5:
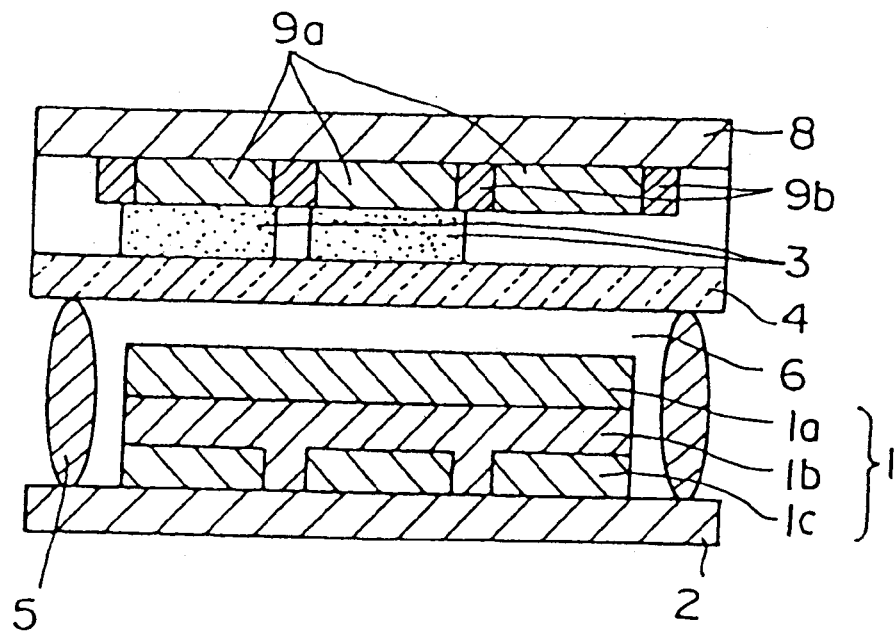
FIG. 5 is a schematic and typical cross section of the multi-color light emission apparatus (first invention) of the present invention showing an example using a color filter and a black matrix.

Also, in the structures (1) to (3), as shown in FIG. 4, the fluorescent layers 3 which emit rays of fluorescent light of different colors are separately disposed on the same plane to obtain emitted light of the three primary colors (RGB). In this case, the plate thickness of the transparent inorganic oxide substrate 4 is preferably in a range of from 1 $\mu$m to 200 $\mu$m. Further, as shown in FIG. 5, a color filter 9a may be arranged on each of the fluorescent layers 3 to control the fluorescent colors and thereby to promote the color purity. Also, a black matrix 9b may be disposed between the fluorescent layers or color filters to prevent light leakage and thereby to promote the visibility of multi-color emitted light.

Next, the multi-color light emission apparatus of the present invention will be illustrated in more detail in terms of each structural element. Materials used for these structural elements are not limited to the materials described hereinafter which correspond to the lowest demands of these elements.

1. Organic EL Device

As the organic EL device of the present invention, it is preferable to use organic EL devices which emit lights ranging from near ultraviolet light to light of a green color, more preferably a blue-green color. The following structures are exemplified for the organic EL device of the present invention to obtain such a light emission.

These structures comprises fundamentally an emitting layer composed of an organic compound which is sandwiched between two electrodes (anode) and (cathode) and other layers may be interposed between them as required. Typical structures for the organic EL device used in the present invention are as follows:

(1) Anode/emitting layer/cathode;
(2) Anode/positive hole injection layer/emitting layer/cathode;
(3) Anode/emitting layer/electron injection layer/cathode; and
(4) Anode/positive hole injection layer/emitting layer/electron injection layer/cathode.

(a) Anode

An anode using, as an electrode material, metals, alloys, electro conductive compounds, and mixtures of these which have a high work function (more than 4 ev) are preferably used. Given as examples of such an electrode material are metals such as Au and electro conductive materials such as CuI, ITO, $SnO_2$, and ZnO. A thin film of each of these electrodes is formed by means of vapor deposition, sputtering, or the like to produce the anode.

If the light emitted from the emitting layer is taken out of the anode in this manner, it is desirable that the transmittance by the anode of the emitted light be more than 10%. In this case, the anode corresponds to the transparent electrode. Also, the sheet resistance of the anode is preferably less than several hundreds $\Omega/\square$. The thickness of the anode is usually from 10 nm to 1 $\mu$m, preferably from 10 nm to 200 nm, although this depends on the material used.

(b) Emitting layer

Major emitting materials for the organic EL device are organic compounds. As specific examples of the organic compounds used for the emitting layer, the following compounds are given, depending on the desired color.

First, emitted light of ultraviolet to the violet color region can be prepared using the organic compounds represented by the following general formula.

wherein X represents the following compound.

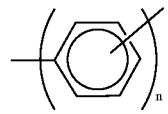

wherein n denotes 2, 3, 4, or 5, and Y represents the following compound.

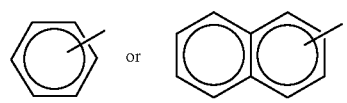

In the above compounds, a phenyl group, phenylene group, and naphthyl group may be substituted with one or more alkyl groups having from 1 to 4 carbon atoms, alkoxy groups, hydroxyl groups, sulphonyl groups, carbonyl groups, amino groups, dimethylamino groups, and diphenylamino groups. Also, these groups may be combined to form a saturated five-membered ring or a saturated six-membered ring. Further, it is preferable that the phenyl group, phenylene group, and naphthyl group be substituted at a para position so as to be easily substituted and to form a smooth deposition film. The compounds represented by the following formula are given as examples of the compounds substituted at a para position. Among these compounds, p-quarterphenyl derivatives and p-quinquephenyl derivatives are preferable.

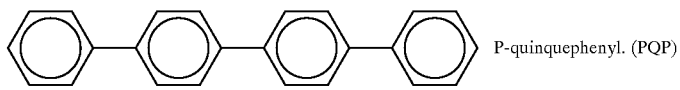

(1) P-quinquephenyl. (PQP)

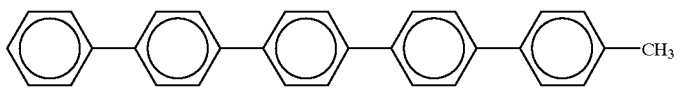

(2)

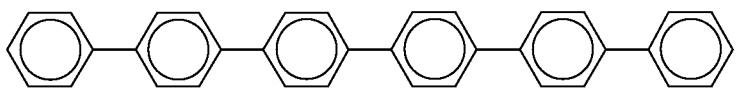

(3)

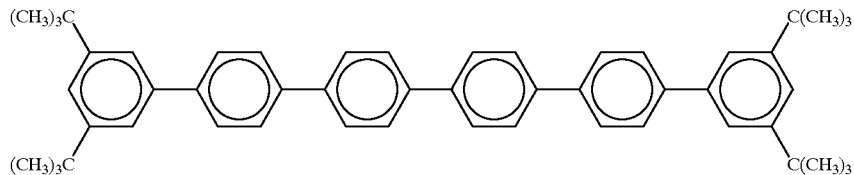

(4) 3, 5, 3''''', 5'''''-tetra-t-butyl-sexiphenyl (TBS)

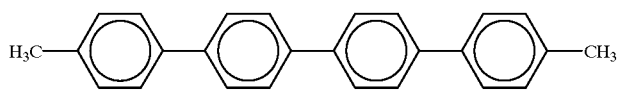
(5)
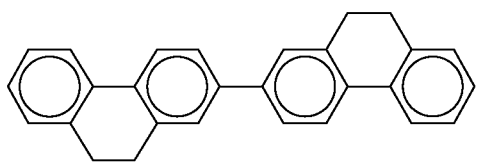
(6)
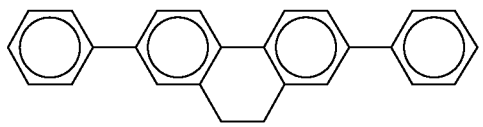
(7)
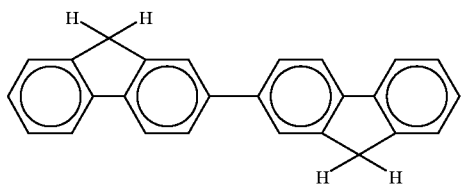
(8)
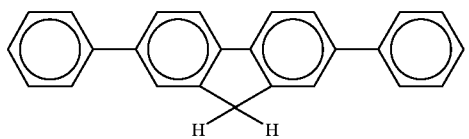
(9)
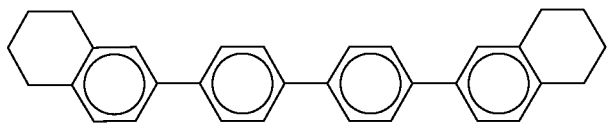
(10)
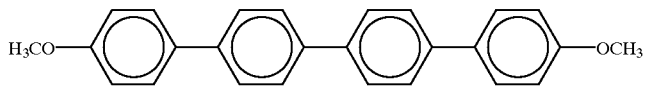
(11)
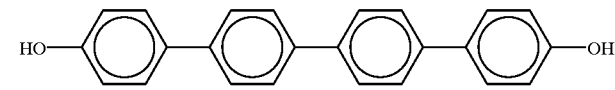
(12)
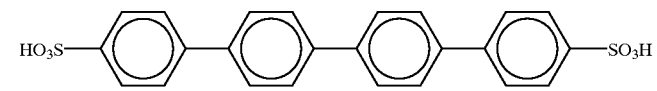
(13)
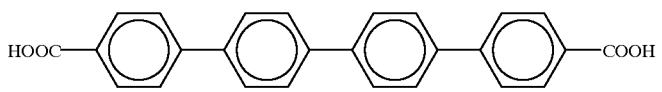
(14)

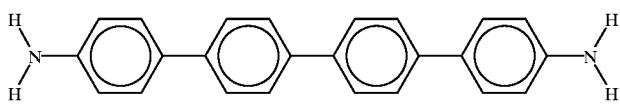

(15)

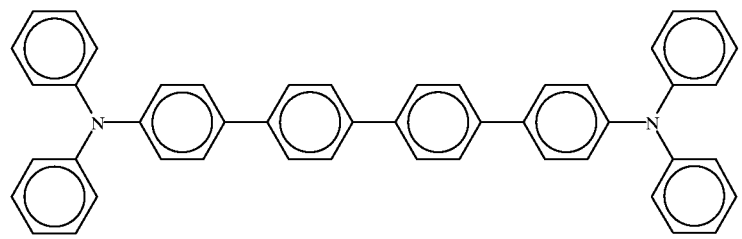

(16)

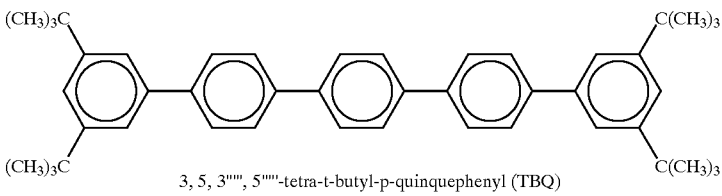

(17)

3, 5, 3'''', 5''''-tetra-t-butyl-p-quinquephenyl (TBQ)

Next, given as examples of the organic compounds used for producing emitted light of a blue color to a blue-green color or a green color are fluorescent bleaching agents such as a benzothiazole type, benzoimidazole type, and benzoxazole type; metal chelated oxinoid compounds, and styryl benzene type compounds.

Illustrating specific compounds, for example, the compounds disclosed in Japanese Patent Application Laid-open No. 194393/1984 are exemplified. Among these, typical examples are fluorescent bleaching agents including a benzoxazole type such as 2,5-bis(5,7-di-t-pentyl-2-benzoxazolyl)-1,3,4-thiadiazole, 4,4'-bis(5,7-di-t-pentyl-2-benzoxazolyl)stilbene, 4,4'-bis(5,7-di-(2-methyl-2-butyl)-2-benzoxazolyl)stilbene, 2,5-bis(5,7-di-t-pentyl-2-benzoxazolyl)thiophene, 2,5-bis(5-α,α-dimethylbenzyl-2-benzoxazolyl)thiophene, 2,5-bis(5-7-di(2-methyl-2-butyl)-2-benzoxazolyl)-3,4-diophenylthiophene, 2,5-bis(5-methyl-2-benzoxazolyl) thiophene, 4, 4'-bis(2-benzoxazolyl) biphenyl, 5-methyl-2-[2-[4-(5-methyl-2-benzoxazolyl)phenyl]vinyl]benzoxazole, 2-[2-(4-chlorophenyl)vinyl]naphtho[1,2-d]oxazole, and the like; benzothiazole type such as 2-2'-(p-phenylenedivinylene)-bisbenzothiazole and the like; and benzoimidazole type such as 2-[2-[4-(2-benzoimidazolyl)phenyl]vinyl]benzoimidazole, 2-[2-(4-carboxyphenyl)vinyl]benzoimidazole, and the like. In addition, other useful compounds are enumerated in Chemistry of Synthetic Dyes, 628–637, P640, (1971).

As the above-mentioned chelated oxinoid compounds, the compounds disclosed in Japanese Patent Application Laid-open No. 295695/1988 can be used. Among these, typical examples are 8-hydroxyquinoline type metal complexes such as tris(8-quinolinol) aluminum, bis(8-quinolinol) magnesium, bis(benzo[f]-8-quinolinol) zinc, bis(2-methyl-8-quinolinolate) aluminum oxide, tris(8-quinolinol) indium, tris (5-methyl-8-quinolinol) aluminum, 8-quinolinol lithium, tris (5-chloro-8-quinolinol) gallium, bis(5-chloro-8-quinolinol) calcium, poly[zinc(II)-bis(8-hydroxy-5-quinolinonyl)methane], and the like and dilithium epinetridione.

As the above-mentioned styryl benzene type compounds, the compounds disclosed in the specifications of EPCs No. 0319881 and No. 0373582 can be also used. Typical examples of these styryl benzene type compounds are 1,4-bis(2-methylstyryl)benzene, 1,4-bis(3-methylstyryl)benzene, 1,4-bis(4-methylstyryl)benzene, distyrylbenzene, 1,4-bis(3-ethylstyryl)benzene, 1,4-bis(2-methylstyryl)-2-methylbenzene, 1,4-bis(2-methylstyryl)-2-ethylbenzene, and the like.

Further, distyryl pyrazine derivatives disclosed in Japanese Patent Application Laid-open No. 252793/1990 can be used as the material for the emitting layer. Typical examples of these derivatives are 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, 2,5-bis[2-(1-pyrenyl)vinyl]pyrazine, and the like.

In addition, the polyphenyl type compounds disclosed in the specification of EPC No. 0387715 can be used as the material for the emitting layer.

Other than the above-mentioned fluorescent bleaching agents, metal chelated oxinoid and styryl benzene, the following compounds can be used as the material for the emitting layer:

12-phthaloperinone (J. Appl. Phys., Vol 27, L713, (1988)), 1,4-diphenyl-1,3-butadiene, 1,1,4,4-tetraphenyl-1,3 butadiene (Appl. Phys. Lett., Vol 56, L799, (1990)), naphthalimide derivatives (Japanese Patent Application Laid-open No. 305886/1990), perillene derivatives (Japanese Patent Application laid-open No. 189890/1990), oxadiazole derivatives (Japanese Patent Application Laid-open No. 216791/1990 or oxadiazole derivatives disclosed by Hamada et al. at the conference of Appl. Phys), aldazine derivatives (Japanese Patent Application Laid-open No. 220393/1990), pyraziline derivatives (Japanese Patent Application Laid open No. 220394/1990), cyclopentadiene derivatives (Japanese Patent Application Laid-open No. 289675/1990), pyrrolopyrrole derivatives (Japanese Patent Application Laid-open No. 296891/1990), styrylamine derivatives (Appl. Phys. Lett., Vol 56, L799, (1990)), coumarine type compounds (Japanese Patent Application Laid-open No. 191694/1990), and macromolecular compounds described in the International Disclosure Official Gazette WO90/13148 or Appl. Phys. Lett., Vol 58, 18, P1982 (1991).

In the present invention, as the materials used for the emitting layer, aromatic dimethylidine type compounds (compounds disclosed in the specification of EPC No. 0388768 or Japanese Patent Application Laid-open NO. 231970/1991) are preferably used. Specific Examples of such compounds are 1,4-phenylenedimethylidyne, 4,4-phenylenedimethylidyne, 2,5-xylenedimethylidyne, 2,6-naphthylenedimethylidyne, 1,4-biphenylenedimethylidyne, 1,4-p-terephenylenedimethylidyne, 9,10-anthracenediyldimethylidyne, 4,4'-bis(2,2-di-t-butylphenylvinyl)biphenyl (hereinafter abbreviated as (DTBPVBi)), 4,4'-bis(2,2-diphenylvinyl)biphenyl (hereinafter abbreviated as (DPVBi), and derivatives of these.

Also, the compounds represented by the general formula $(R_s-Q)_2-AL-O-L$, which are described in Japanese Patent Application Laid-open No. 258862/1993 can be used, wherein L represents a hydrocarbon having 6–24 carbon atoms and including a phenyl group, O-L represents a phenolate ligand, Q represents a substituted 8-quinolinolate ligand, Rs represents an 8-quinolinolate ring substitutional group selected to stereo-chemically prevent three or more substituted 8-quinolinolate ligands from binding with an aluminum atom.

Given as specific examples of such compounds are bis (2-methyl-8-quinolinolate)(para-phenylphenolate) aluminum (III) (hereinafter abbreviated as (PC-7)) and bis(2-methyl-8-quinolinolate)(1-naphtholate) aluminum (III) (hereinafter abbreviated as (PC-17)).

In addition, Japanese Patent Application Laid-open No. 9953/1994 discloses a method for producing mixed emitted light of a blue color and a green color by doping in an efficient manner. When using this method for forming the emitting layer of the present invention, the above-mentioned emitting material is used as a host. As a dopant, a strongly fluorescent coloring material of a blue color to a green color, for example, a coumarin type or fluorescent coloring material similar to those used in the above method can be given. Specifically, as the host, fluorescent materials mainly composed of distyryl arylene, preferably, for example, DPVBi can be given. As the dopant, diphenylaminostyryl arylene, preferably, for example, 1,4-bis{4-N,N'-diphenylamino}styryl}benzene (DPAVB) can be given.

As the methods for forming an emitting layer using the above materials, known methods, for example, a vapor deposition method, a spin-coating method, a LB method, or the like can be applied. A preferred emitting layer is especially a molecularlysedimentary film. The molecularly sedimentary film is a film formed by deposition of a subject compound in a vapor phase or a film formed by solidifying a subject compound in a solution or in a liquid phase. The molecularly sedimentary film is generally distinguished from a thin film (molecularly cumulative film) formed in the LB method by differences in a coagulating structure and a high-order structure, or by a functional difference caused by those structures.

Also, the emitting layer can be formed in a similar manner by a method disclosed in Japanese Patent Application Laid-open No. 51781/1982 in which a binding agent such as a resin and a subject compound are dissolved in a solvent to make a solution and then a thin film is formed from the solution using a spin-coating method or the like.

The thickness of the emitting layer is preferably in a range from 5 nm to 5 μm, though there are no limitations to the thickness of the emitting layer produced in such a manner and the thickness of the emitting layer is optionally selected.

The emitting layer of the organic EL device has also the following functions.

(1) Injection functions which allow positive holes to be injected from an anode or a positive hole injecting layer in the presence of an electric field and allow electrons to be injected from a cathode or an electron injecting layer.

(2) Transferring functions which allow the injected charges (electrons and positive holes) to be transferred by electric field force.

(3) Emitting functions which allows electrons and positive holes to be combined to emit light.

Incidentally, there may be a difference in ease between the injecting of electrons and the injecting of positive holes. Also, there maybe adifference between the transferability of positive holes and that of electrons in terms of mobility. However, it is desirable to transfer either positive holes or electrons.

(c) Positive hole injecting layer

Any material optionally selected from photo-conductive materials conventionally used as a material for transferring a charge of positive holes and from known materials used for a positive hole injecting layer of an organic EL device can be used as the material for the positive hole injecting layer provided as required. The material for the positive hole injecting layer which has a function either as a positive hole injecting layer or as a barrier for an electron may be either an organic or inorganic compound.

Given as examples of these conventional materials are triazole derivatives (see the specification of U.S. Pat. No. 3,112,197, etc.), oxadiazole derivatives (see the specification of U.S. Pat. No. 3,189,447, etc.), imidazole derivatives (Japanese Patent Publication No. 16096/1962, etc.), polyarylalkane derivatives (see the specifications of U.S. Pat. No. 3,615,402, U.S. Pat. No. 3,820,989, U.S. Pat. No. 3,542,544, Japanese Patent Publications No. 555/1970 and No. 10983/1976, and Japanese patent Applications laid-open No. 93224/1976, No. 17105/1980, No. 4148/1981, No. 108667/1980, No. 156953/1980, and No. 36656/1981, etc.), pyrazoline derivatives and pyrazolone derivatives (see the specifications of U.S. Pat. No. 3,180,729, U.S. Pat. No. 4,278,746, and Japanese Patent Applications Laid-open No. 88064/1980, No. 88065/1980, No. 105537/1974, No. 51086/1980, No. 80051/1981, No. 88141/1981, No. 45545/1982, No. 112637/1979, and No. 74546/1980, etc.), phenylenediamine derivatives (see the specifications of U.S. Pat. No. 3,615,404, Japanese Patent Publications No. 10105/1976, No. 3712/1971, and No. 25336/1972, Japanese Patent Applications Laid-open No. 53435/1979, No. 110536/1979, and No. 119925/1979, etc.), arylamine derivatives (see the specifications of U.S. Pat. No. 3,567,450, U.S. Pat. No. 3,240, 597, U.S. Pat. No. 3,658,520, U.S. Pat. No. 4,232,103, U.S. Pat. No. 4,175,961, U.S. Pat. No. 4,012,376, Japanese Patent Publications No. 35702/1974 and No. 27577/1964, Japanese Patent Applications Laid-open No. 144250/1980, No. 119132/1981, and No. 22437/1981, and DRP No. 1,110,518, etc.), amino substituted chalcone derivatives (see the specification of U.S. Pat. No. 3,526,501, etc.), oxazole derivatives (see the specification of U.S. Pat. No. 3,257,203, etc.), styrylanthracene derivatives (see the specification of Japanese Patent Application Laid-open No. 46234/1981, etc.), fluorenone derivatives (see the specification of Japanese Patent Application Laid-open No. 110837/1979 and etc.), hydrazone derivatives (see the specifications of U.S. Pat. No. 3,717,462, Japanese Patent Applications Laid-open No. 59143/1979, No. 52063/1980, No. 52064/1980, No. 46760/1980, No. 85495/1980, No. 11350/1982, No. 148749/1982, and No. 311591/1990, etc.), stilbene derivatives (see the specifications of Japanese Patent Applications Laid-open No. 210363/1986, No. 228451/1986, No. 14642/1986, No. 72255/1986, No. 47646/1987, No. 36674/1987, No. 10652/1987, No. 30255/1987, No. 93445/1985, No. 94462/1985, No. 174749/1985, and No. 175052/1985, etc.), silazane derivatives (see the specification of U.S. Pat. No. 4,950,950, etc.), polysilane type (see the specification of Japanese Patent Application Laid-open No. 204996/1990, etc.), aniline type copolymers (see the specification of Japanese Patent Application Laid-open No. 282263/1990, etc.), and electro conductive macromolecular oligomers (especially a thiophene oligomer) disclosed in Japanese Patent Application Laid-open No. 211399/1989.

As the materials used for the positive hole injecting layer, the above compounds can be used. Among these, polphyrin compounds (disclosed in Japanese Patent Application Laid-open No. 2956965/1988) and aromatic tertiary amines and styrylamine compounds (see the specifications U.S. Pat. No. 4,127,412, Japanese Patent Applications Laid-open No. 27033/1978, No. 58445/1979, No. 149634/1979, No. 64299/1979, No. 79450/1980, No. 144250/1980, No. 119132/1981, No. 295558/1986, No. 98353/1986, and No. 295695/1988, etc.) are preferable. It is especially preferable to use the aromatic tertiary amines.

Typical examples of the above porphyrin compounds are porphin, 1,10,15,20-tetraphenyl-21H, 23H-porphin copper (II), 1,10,15,20-tetraphenyl-21H, 23H-porphin zinc (II), 5,10,15,20-tetrakis(pentafluorophenyl)-21H, 23H-porphin, silicon phthalocyanine oxide, aluminum phthalocyanine chloride, phthalocyanine (non-metal), dilithium phthalocyanine, copper tetramethylphthalocyanine, copper phthalocyanine, chromium phthalocyanine, zinc phthalocyanine, lead phthalocyanine, titanium phthalocyanine oxide, magnesium phthalocyanine, copper octamethylphthalocyanine, and the like.

Typical examples of the above aromatic tertiary amine and styrylamine compounds are N,N,N',N'-tetraphenyl-4,4'-diaminophenyl, N,N'-diphenyl-N,N'-bis-(3-methylphenyl)-[1,1'-biphenyl]-4,4'-diamine (hereinafter abbreviated as "TPD"), 2,2-bis (4-di-p-tolylaminophenyl)propane, 1,1-bis (4-di-p-tolylaminophenyl)cyclohexane, N,N,N',N'-tetra-p-tolyl-4,4'-diaminophenyl, 1,1-bis(4-di-p-tolylaminophenyl)-4-phenylcyclohexane, bis(4-dimethylamino-2-methylphenyl)phenylmethane, bis(4-di-p-tolylaminophenyl)phenylmethane, N,N'-diphenyl-N,N'-di (4-methoxyphenyl)-4,4'-diaminobiphenyl, N,N,N',N'-tetraphenyl-4,4'-diaminophenyl ether, 4,4-bis (diphenylamino)quadriphenyl, N,N,N-tri(p-tolyl)amine, 4-(di-p-tolylamino)-4'-[4(di-p-tolylamino)styryl]stilbene, 4-N,N-diphenylamino-(2-diphenylvinyl)benzene, 3-methoxy-4'-N,N-diphenylaminostylbenzene, N-phenylcarbazole, compounds having two condensed aromatic rings in a molecule, for example, 4,4'-bis(N-(1-naphthyl)-N-phenylamino)biphenyl (hereinafter abbreviated as (NPD)) disclosed in U.S. Pat. No. 5,061,569, and compounds in which three triphenylamine units are combined in a star-burst shape, for example, 4,4',4"-tris[N-(3-methylphenyl)-N-phenylamino]triphenylamine (hereinafter abbreviated as (MTDATA)) disclosed in Japanese Patent Application Laid-open No. 308688/1992, and the like.

Also, other than the above-mentioned aromatic dimethylidine compounds shown as the material for the emitting layer, inorganic compounds such as p type Si and p type SiC can be utilized as the material used for the positive hole injecting layer.

The positive hole injecting layer can be produced by forming a thin film of the above-mentioned compound using a conventional method such as a vacuum deposition method, spin-coating method, casting method, LB method, or the like. There are no restrictions as to the thickness of the positive hole injecting layer. However, the thickness of the positive hole injecting layer is generally from 5 nm to 5 $\mu$m. This positive hole injecting layer may be structured of one layer made from one or more of the above materials or may be a layer in which other positive hole injecting layers made from compounds differing from the compound of that layer are laminated on that layer.

(d) Electron injecting layer

The electron injecting layer provided as required may have the function of transferring, to the emitting layer, the electrons injected from the cathode. Optionalcompounds selected from conventionally known compounds may be used.

Typical examples of these compounds include nitro-substituted fluorene derivatives; anthraquinodimethane derivatives disclosed in Japanese Patent Applications Laid-open No. 149259/1982, No. 55450/1983, and No. 104061/1988; diphenylquinone derivatives, thiopyrane dioxide derivatives, heterocyclic tetracarboxylic acid anhydrides such as naphthaleneperillene and the like, and carbodiimides which are all disclosed in Polymer Preprints, Japan Vol. 37. No. 3 (1988) p. 681 and the like; fluorenylidenemethane derivatives disclosed in Japanese Journal of Applied Physics, 27, L269 (1988), Japanese Patent Applications Laid-open No. 696657/1985, No. 143764/1986, and No. 148159/1986; anthraquinonedimethane and anthrone derivatives disclosed in Japanese Patent Applications Laid-open No. 225151/1986 and No. 233750/1986; oxadiazole derivatives disclosed by the above-described Hamada et al. at the conference of Appl. Phys; and a series of an electron transfer compounds disclosed in Japanese Patent Application Laid-open No. 194393/1984. Incidentally, though the above electron transfer compounds are disclosed as the materials used for the emitting layer in Japanese Patent Application Laid-open No. 194393/1984, it is confirmed as a result of the studies of the present inventors that these compounds can be used as the materials for the electron injecting layer.

Also, thiazole derivatives produced by replacing an oxygen atom of the above oxadiazole ring with a sulfur atom and quinoxaline derivatives having a quinoxaline ring known as an electron attracting group are given as examples of the materials for the electron injecting layer. Further, included as examples of the materials for the electron injecting layer are metal complexes of 8-quinolinole, specifically, tris(8-quinolinole) aluminum (hereinafter abbreviated as "Alq"), tris(5,7-dibromo-8-quinolinole) aluminum, tris(2-methyl-8-quinolinole) aluminum, tris(5-methyl-8-quinolinole) aluminum, bis(8-quinolinole) zinc (hereinafter abbreviated as "Znq"), and metal complexes produced by replacing the primary metals of these metal complexes with In, Mg, Cu, Ca, Sn, Ga, or Pb.

Other than the above, metal-free or metal phthalocyanine compounds of 8-quinolinole derivatives or compounds produced by replacing the terminal group of these compounds with an alkyl group, sulphonic acid group, or the like. Also, the distyryl pyrazine derivatives can be used as the materials for the electron injecting layer. Similar to the positive hole injecting layer, inorganic semiconductors such as n-type-Si, n-type-SiC, or the like may be used.

The electron injecting layer can be produced by forming a thin film of the above-mentioned compound using a conventional method such as a vacuum deposition method, spin-coating method, casting method, LB method, or the like. There are no restrictions as to the thickness of the electron injecting layer. However, the thickness of the electron injecting layer is generally from 5 nm to 5 $\mu$m. This electron injecting layer may be structured of one layer made from one or more of the above materials or may be a layer in which other electron injecting layers made from compounds differing from the compound of that layer are laminated on that layer.

(e) Cathode

As examples of the cathode, those using, as an electrode material, metals (these are called "electron injecting metal"), alloys, electro conductive compounds, and mixtures of these which have a low work function (less than 4 eV) are used. Given as examples of such an electrode material are metals such as sodium, sodium/potassium alloy, magnesium, lithium, magnesium/copper mixtures, magnesium/silver mixtures, magnesium/aluminum mixtures, magnesium/indium mixtures, aluminum/aluminum oxide ($Al_2O_3$), indium, lithium/aluminum mixtures, and rare earth metals, and the like. Among these, preferred examples are mixtures of the electron injecting metal and a secondary metal which has a high work function and is stable in consideration of electron injecting capability and durability to oxidation as an electrode. Specifically, magnesium/silver mixtures, magnesium/aluminum mixtures, magnesium/indium mixtures, aluminum/aluminum oxide ($Al_2O_3$), and lithium/aluminum mixtures are given as the preferred examples.

A thin film of each of these electrode materials is formed by means of vapor deposition, sputtering, or the like to produce the cathode.

If the light emitting from the emitting layer is taken out of the cathode in this manner, it is desirable that the transmittance by the cathode of the emitted light be more than 10%. In this case, the cathode corresponds to the transparent electrode.

Here, the sheet resistance of the cathode is preferably less than several hundreds $\Omega/\square$. The thickness of the cathode is usually from 10 nm to 1 $\mu$m, preferably from 50 nm to 200 nm.

In the multi-color light emission apparatus using an organic EL device as a emitting member, for example, one electrode pattern line perpendicular to another pattern line is usually formed. When forming the electrode on a thin film of an organic compound layer such as an emitting layer or the like using a photolithography method including wet etching, an organic compound layer is caused to greatly deteriorate so that the photography method cannot be used in a stable manner. Therefore, the electrode pattern is formed through a mask having a desired shape when the electrode (anode or cathode) materials are treated by vapor deposition or sputtering. When the electrode is not formed on a thin film of the organic compound layer for example on the glass plate, the pattern of the electrode pattern may be formed by photolithography.

(f) Manufacture of organic EL device (example)

Using the above exemplified materials and methods, anode (for example, transparent electrode), an emitting layer, positive hole injecting layer as required, and electron injecting layer as required are formed and further a cathode (for example, electrode) is formed in that order to manufacture an organic EL device. Also, an organic EL device can be manufactured in the reverse order.

A manufacturing example of an organic EL device having a structure in which an anode, a positive hole injecting layer, a emitting layer, an electron injecting layer, and a cathode are provided in that order on a support substrate is illustrated below.

First, a thin film of a thickness of less than 1 $\mu$m, preferably from 10 to 200 nm is formed of an anode material by vapor deposition, sputtering, or the like to form an anode. Next, a positive hole injecting layer is formed on the anode. Formation of the positive hole injecting layer can be carried out, as mentioned above, by means of vacuum deposition, spin-coating, casting, LB, or the like. Among these means, vacuum deposition is preferable to form a homogeneous film with ease and to prevent occurrence of pin holes. When forming the positive hole injecting layer by means of vacuum deposition, the depositing conditions differ depending on the sort of compound (material for the positive hole injecting layer) to be used, the crystalline structure and the recombination structure of the object positive hole injecting layer, and the like. However, it is generally preferable to appropriately select the depositing conditions from a depositing source temperature ranging from 50 to 450° C., a vacuum ranging from $10^{-7}$ to $10^{-3}$ torr, a depositing speed ranging from 0.01 to 50 nm/sec, a substrate temperature ranging from –50 to 300° C., and a film thickness ranging from 5 nm to 5 $\mu$m.

Next, an emitting layer is formed on the positive hole injecting layer using a desired organic emitting material. Formation of the emitting layer can be carried out by providing a thin film of the organic emitting material by means of vacuum deposition, sputtering, spin-coating, and casting. Among these means, vacuum deposition is preferable to form a homogeneous film with ease and to prevent occurrence of pin holes. When forming the emitting layer by means of vacuum deposition, the depositing conditions differ depending on the sort of compound to be used. Generally, the depositing conditions can be selected from almost the same condition ranges as in the formation of the positive hole injecting layer.

Next, an electron injecting layer is formed on the emitting layer. It is preferable to form the electron injecting layer by vacuum deposition to produce a homogeneous film in the same way as in the formation of the positive hole injecting layer or the emitting layer. The depositing conditions can be selected from almost the same condition ranges as in the formation of the positive hole injecting layer or the emitting layer.

Finally, a cathode is laminated on the electron injecting layer to produce an organic EL element.

The cathode is formed of a metal so that vapor deposition or sputtering can be used. However, vacuum deposition is preferably used to protect the backing organic material from damage in forming a film.

When the organic EL device are produced in the above-mentioned processes, it is preferable that the steps from the step of forming the anode to the step of forming the cathode are thoroughly processed in one evacuating operation.

Incidentally, in the case where a d.c. voltage is applied to the organic EL device, when applying 5–40 volts, allowing the anode and the cathode to be provided with the positive (+) polarity and the negative (–) polarity respectively, luminance can be detected. When both the anode and the cathode are inversely polarized, current never flows and luminance is not detected. Further, if an a.c. voltage is applied, luminance can be detected only at the time when the anode and the cathode are respectively polarized to the (+) polarity and the (–) polarity. The wave form of the a.c. current to be applied is optional.

2. Support Substrate

Materials which are not composed of an organic compound are preferable as the materials for the support substrate used in the present invention. Transparency is not required for the materials of the support substrate. Materials which are shielded from light are rather preferable to output light from the fluorescent layer. It is desirable that at least the surface of the support substrate facing the organic EL device be composed of an insulating material. There are no limitations to the thickness of the support substrate to the extent that it can reinforce a thin transparent glass plate to be laminated subsequently without camber and distortion.

Typically, for example, a ceramic plate, metal plates which are processed by insulating treatment using inorganic oxides such as silica, alumina, or the like can be used as the materials for the support substrate. In the case of using transparent materials such as glass plates (soda lime glass, heat resistance glass, and the like), quartz glass plates, or the like, the surface opposite to the organic EL device may be provided with a light-shielding film, reflecting plate with a black film, or the like.

3. Fluorescent Layer

The fluorescent layer used in the present invention is composed of, for example, a fluorescent coloring material and a resin or of an independent fluorescent coloring material. The fluorescent layer composed of the fluorescent coloring material and the resin are, for example, a solid type produced by dissolving or dispersing the fluorescent coloring material in the binder resin.

Specific examples of types of coloring material will be explained. First given as examples of the coloring material converting ultraviolet or violet emission of the organic EL device to blue emission are stilbene type coloring materials such as 1,4-bis(2-methyl styryl) benzene (hereinafter abbreviated as (Bis-MSB)) and trans-4,4'-diphenyl stilbene (hereinafter abbreviated as (DPS)) and coumarin type coloring materials such as 7-hydroxy-4-methyl coumarin (hereinafter abbreviated as (coumarin 4)).

Given as examples of the coloring material converting blue or blue-green emission of the organic EL device to green emission are a coumarin type coloring material such as 2,3,5,6-1H, 4H-tetrahydro-8-trifluoromethylquinolizino (9,9a,1-gh)coumarin (hereinafter abbreviated as (coumarin 153)), 3-(2'-benzothiazolyl)-7-diethylaminocoumarin (hereinafter abbreviated as (coumarin 6)), and 3-(2'-benzimidazolyl)-7-N,N'-diethylaminocoumarin (hereinafter abbreviated as (coumarin 7)), other coumarin coloring material type dyes such as basic yellow 51, and naphthalimide type coloring materials such as solvent yellow 11 and solvent yellow 116.

Given as examples of the coloring material converting blue-green emission of the organic EL device to orange-red emission are cyanine type coloring materials such as 4-dicyanomethylene- 2-methyl-6-(p-dimethylaminostyryl)-4-H-pyran (hereinafter abbreviated as (DCM)), pyridine type coloring materials such as 1-ethyl-2-(4-(p-dimethylaminophenyl)-1,3-butadienyl)-pyridinium-perchlorate (hereinafter abbreviated as (pyridine 1)), rhodamine type coloring materials such as rhodamine B and rhodamine 6G, and oxazine type coloring materials.

Further, various dyes (direct dye, acidic dye, basic dye, disperse dye) can be used provided that they exhibit fluorescence. Also, pigmental materials in which the above fluorescent coloring material is kneaded in advance in a pigmental resin such as polymethacrylate ester, polyvinyl chloride, vinyl chloride-vinyl acetate copolymer, alkyd resin, aromatic sulphonamide resin, urea resin, melamine resin, benzoguanamine resin, or the like may be used.

In addition, these types of fluorescent coloring materials and pigments may be, as required, used either independently or in combination. The conversion rate of the fluorescent coloring material to red color is low. By mixing the above pigments, the rate of conversion from light emission to fluorescent emission can be increased.

On the other hand, as the binder resin, transparent materials (transmittance of visible rays: more than 50%) are preferable. Given as examples of such transparent materials are transparent resins (polymer) such as polymethyl methacrylate, polyacrylate, polycarbonate, polyvinyl alcohol, polyvinyl pyrrolidone, hydroxyethyl cellulose, and carboxymethyl cellulose.

Incidentally, photosensitive resins which can be used in photolithography are also selected to separately dispose the fluorescent layers on the same plane. For example, photo-curable resists having a reactive vinyl group such as an acrylate type, methacrylate type, vinyl polycinnamate type, and cyclic rubber type are given as examples of the photosensitive resins. When using a printing method, printing inks (medium) using a transparent resin are selected. Given as examples of these transparent resins are a polyvinyl chloride resin, melamine resin, phenol resin, alkyd resin, epoxy resin, polyurethane resin, polyester resin, maleic acid resin, monomers, oligomers, and polymers of a polyamide resin, polymethylmethacrylate, polyacrylate, polycarbonate, polyvinyl alcohol, polyvinyl pyrrolidone, hydroxyethyl cellulose, and carboxymethyl cellulose.

The fluorescent layers are commonly manufactured by the following processes. The fluorescent layers mainly composed of fluorescent coloring materials are manufactured by forming a film using a vacuum deposition method or a sputtering method through a mask on which a desired pattern is formed for the fluorescent layers. On the other hand, the fluorescent layers composed of fluorescent coloring materials and a resin are manufactured by mixing fluorescent coloring materials, a resin, and a resist, dispersing or solubilizing to allow the mixture to be liquefied, forming a film using a spin-coating method, roll-coating method, or casting method, and patterning with a desired pattern for the fluorescent layers using a photolithographic method or a screen printing method.

There are no limitations to the thickness of the fluorescent layers to the extent that the emission of the organic EL elements is sufficiently absorbed and the function of emitting fluorescent light is not impaired. The thickness of the fluorescent layers is in a range of from 10 nm to 1 mm approximately.

For the fluorescent layer composed, especially, of fluorescent coloring materials and a binder resin, the concentration of the fluorescent coloring material may be in such a range as that the emission of the organic EL device can be absorbed efficiently without concentration quenching of fluorescence. The concentration of the fluorescent coloring material is in a range of from 1 to $10^{+4}$ mol/kg approximately to the binder resin to be used, though this depends on the type of the fluorescent coloring material.

In addition, because the fluorescence conversion efficiency, especially, to a red color is low, fluorescent layers of a green color and a red color may be laminated to improve the efficiency.

4. Transparent Inorganic Oxide Substrate

As examples of the transparent inorganic oxide substrate used in the present invention, a substrate composed of a transparent and electrically insulating inorganic oxide layer as shown in the second invention is given. However, the substrate is not necessarily formed of an electrically insulating material.

Such an inorganic oxide substrate has a high efficiency in shielding, especially, aqueous vapor, oxygen, organic compound gas, and the like.

It is desirable that the plate thickness be as small as possible to improve the characteristics in the angle of view, when the fluorescent layers which absorb the light emission from the organic EL device and emit different fluorescent emission are separately disposed on the same plane to emit multi-color light such as the three primary colors (RGB).

Usually, inorganic oxide substrates with a thickness of from 700 μm to 1.1 mm are often used for a liquid crystal. However, in the present case, an inorganic oxide substrate with a thickness of from 1 μm to 700 μm, and preferably from 1 μm to 200 μm is used.

If the thickness of the inorganic oxide substrate is not greater than 1 μm, it is difficult to handle the inorganic oxide substrate which tends to be broken. Also, when such inorganic oxide substrate is applied to the support substrate on which the organic EL devices are laminated, using a sealing means, the inorganic oxide substrate is bent, showing remarkable camber or distortion. On the other hand, if the thickness exceeds 200 μm, there is the case where the light emitted from the organic EL device leaks from gaps between the inorganic oxide substrate and the fluorescent layer, which causes a narrow angle of view for multi-color light emission, thereby reducing practicability, though this depends on the fineness of the fluorescent layer.

5. Sealing Means

There are no limitations as to the sealing means used in the present invention. Materials, for example, composed of an ordinary adhesive may be used as the sealing means.

Specifically, given as examples of the adhesive are photocurable or heatcurable adhesives having a reactive vinyl group of an acrylate type oligomer and methacrylate type oligomer; and moisture-curable adhesives such as 2-cyanoacrylate and the like. In addition, heat and chemical curable type adhesives (two-liquid mixing type) can be used. Also, hotmelt type polyamide, polyester, and polyolefin are given as examples of the adhesive. Adhesives capable of adhering and curing at from room temperature to 80° C. are preferable because there is the case where the organic EL device deteriorates from heat treatment.

Application of the adhesive to a sealing portion may be carried out using a dispenser or by printing such as screen printing.

There is no problem in curing after the application in the case of using visible light. However, there is the case where the organic EL device deteriorates when UV light is used and hence a method in which the organic EL device is never irradiated with UV light such as by masking or the like is effective.

6. Gap

In the present invention, the gap provided between the transparent inorganic oxide substrate and the organic EL device is used to absorb impact or stress on the organic EL device. If a material used for a sealing means is directly applied to the organic EL device, the organic EL device tends to be broken by the stress produced when the material is cured.

It is desirable that inert gas such as nitrogen, argon, or the like, or an inactive liquid such as hydrocarbon fluoride or the like be sealed into the gap, because the organic EL device are liable to be oxidized by air if only air is present in the gap.

If the width of the gap is large in the case of using very fine multi-color light emission, light leakage increases and hence the angle of view is greatly reduced. Therefore, the width of the gap should be preferably small, specifically from several μm to 200 μm in general, though this depends on the fineness of the multi-color light emission.

7. Protective Layer of the Fluorescent Layers (transparent flat film)

A protective layer of the fluorescent layers (transparent flat film) used as required in the present invention is used so that the fluorescent layer and color filter (including a black matrix) located at the outside of the multi-color light emission apparatus are protected from physical damage and deterioration from externally environmental factors such as water, oxygen, light, and the like. The protective layer is preferably composed of a transparent material with a visible light transmittance of 50% or more.

Specifically, as examples of the material for the protective layer, compounds having a reactive vinyl group of an acrylate type or methacrylate type such as a photocurable resin and/or heat-curable resin can be given.

Also, given as examples of the material for the protective layer are transparent materials such as a melamine resin, phenol resin, alkyd resin, epoxy resin, polyurethane resin, polyester resin, maleic acid resin, monomer, polymer, or oligomer of a polyamide resin, polymethyl methacrylate, polyacrylate, polycarbonate, polyvinyl alcohol, polyvinyl pyrrolidone, hydroxyethyl cellulose, and the like.

A UV ray absorber may be added to the protective layer to improve the light resistance of the fluorescent layer.

The protective layer is prepared by forming a film of the above material by spin-coating, roll coating, casting, or the like when the material is liquid. If the material is a photocurable resin, the film is irradiated with UV rays and is heat-cured as required, whereas if the material is a heat-curable resin, the film is heat-cured as is after the film is formed. On the other hand, when the material is shaped as a film, the material may be applied to the fluorescent layer using an adhesive.

There are no limitations as to the thickness of the protective layer since it has no influence on the angle of view. However, when the thickness is too great, it has some influence on the light transmittance, so that the thickness is preferably in a range from 1μm to 5 mm.

8. Transparent Substrate

Given as examples of the material used for a transparent substrate are transparent glass substrates (ordinary visual light transmittance of 50% or more) including inorganic oxide substrates composed of such materials as soda lime glass, heat resistance glass, quartz plate, and the like, and polymer substrates.

Because the thickness of the transparent substrate has no influence on the angle of view, there are no limitations as to the thickness. However, when the thickness is too great, it has some influence on the light transmittance, so that the thickness is preferably in a range from 1 μm to 5 mm.

This transparent substrate is used for protecting the fluorescent layer. The transparent substrate is also used for a support substrate in the step of forming a film of the fluorescent layer. Specifically, the above-mentioned inorganic oxide substrate is applied to the transparent substrate using an ordinary transparent adhesive used such for the sealing means, after the formation of the film of the fluorescent layer. The resulting substrate may be then combined with the support substrate on which the organic EL device is laminated to seal the organic EL device.

9. Color Filter and Black Matrix

A color filter and black matrix used as required in the present invention are formed, for example, by performing desired patterning on desired positions of a material selected from known materials, by photolithography or printing.

10. Action of the Present Invention

In the present invention, the fluorescent layer is disposed in the position opposite to the organic EL device through the inorganic oxide substrate so that gaseous substances such as organic monomers, aqueous vapor, and the like which cause the device to deteriorate are cut by the inorganic substrate, whereby the life of the organic EL device and hence the life of the multi-color light emission apparatus using the organic EL device can be improved.

Generally, fluorescent layers which each absorb light of one color emitted from the organic EL device are separately disposed on the same plane to obtain light emission of a plurality of colors such as RGB primary colors or the like. The present invention uses the transparent inorganic oxide substrate which is disposed on the fluorescent layer facing the organic EL device whereby the above-mentioned effects are expected. Also, the plate thickness of the transparent inorganic substrate is in a range of from 1 μm to 200 μm in the present invention, whereby not only are the above-mentioned effects obtained, but also the absorption of the light emitted from the organic EL device to a fluorescent layer other than the desired fluorescent layer and light leakage from the gap between the fluorescent layer and the organic EL device decrease and hence light of a desired color can be produced, ensuring improvement in the characteristics in the angle of view for multi-color light emission.

Here, the fluorescent layer is used instead of a color filter because compared with the case of using the color filter highly efficient multi-color light emission can be expected as mentioned above.

When a fluorescent layer is disposed on the outside of a multi-color light emission apparatus, there are cases where the fluorescent layer is damaged by handling and deteriorates from external environmental factors such as water, oxygen, light, and the like. In this invention, however, the protective layer of the fluorescent layers is disposed on the fluorescent layer, thereby protecting the fluorescent layer. Also, the transparent substrate is used for protecting the fluorescent layer or for a support substrate in the step of forming the fluorescent layer.

II. Multi-color Light Emission Apparatus (second invention) and Process for Manufacturing Thereof (third invention)

The second invention of the present application, designated as apparatus 20, has, specifically, a structure selected from the structures (1) to (4) describe below from the above points of view. These structures (1) to (4) are shown in FIGS. 9–12. Incidentally, a fluorescent layer may convert the light emitted from the organic EL device into light of a wave length longer than that of the light emitted from the organic EL device. The converted color is not limited to the following red or green color.

(1) Transparent support substrate 11/fluorescent layer 3R for converting into red color (hereinafter called "red color conversion fluorescent layer"), fluorescent layer 3G for converting into green color (hereinafter called "green color conversion fluorescent layer")/transparent and electrically insulating inorganic oxide layer 12/organic EL device 1 (transparent electrode 1a/organic compound layer 1b/electrode 1c);

(2) Transparent support substrate 11/red color conversion fluorescent layer 3R, green color conversion fluorescent layer 3G/adhesive layer 13/transparent and electrically insulating inorganic oxide layer 12/organic EL device 1 (transparent electrode 1a/organic compound layer 1b/electrode 1c);

(3) Transparent support substrate 11/red color conversion fluorescent layer 3R, green color conversion fluorescent layer 3G/protective layer of the fluorescent layers (transparent flat film) 7/adhesive layer 13/transparent and electrically insulating inorganic oxide layer 12/organic EL device 1 (transparent electrode 1a/organic compound layer 1b/electrode 1c); and (4) Transparent support substrate 11/red color conversion fluorescent layer 3R, green color conversion fluorescent layer 3G/protective layer of the fluorescent layers (transparent flat film) 7/transparent and electrically insulating inorganic oxide layer 12/organic EL device 1 (transparent electrode 1a/organic compound layer 1b/electrode 1c).

A red color filter and a green color filter may be assembled between the red color conversion fluorescent layer 3R and the transparent substrate, and between the green color conversion fluorescent layer 3G and the transparent substrate respectively, thereby adjusting colors of light of a red color and of a green color to improve these color purities.

A blue color filter 14 may be disposed in parallel and between the red color conversion fluorescent layer 3R and the green color conversion fluorescent layer 3G, thereby adjusting the colors of light emitted from the organic EL device to improve the color purities.

Figure 13:
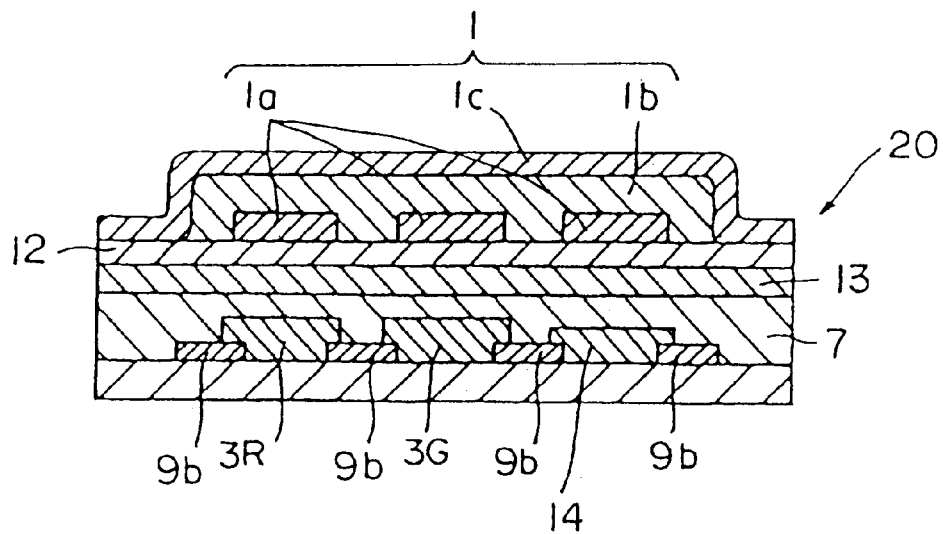
FIG. 13 is a schematic and typical broken view of the multi-color light emission apparatus (second invention) of the present invention showing a still further embodiment using a color filter and a black matrix.

Also, as shown in FIG. 13, a black matrix 9b may be disposed at least in a space between the fluorescent layers 3R and 3G, and/or the color filter 14 to cut leakage of light emitted from the organic EL device 1 and thereby to improve the visibility of multi-color light emission.

Figure 14:
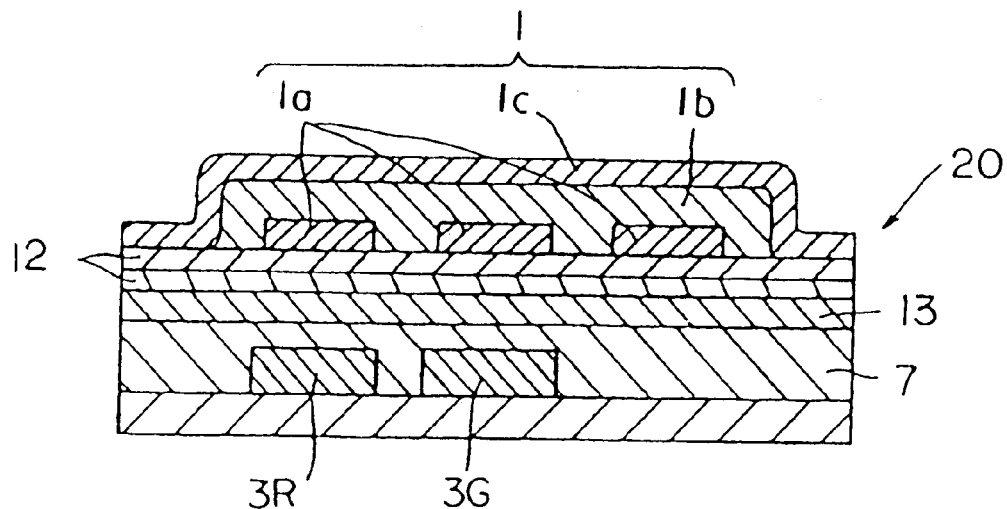
FIG. 14 is a schematic and typical cross section of the multi-color light emission apparatus (second invention) of the present invention showing a still further embodiment using a transparent adhesive layer, a protective layer of the fluorescent layers, and two transparent and insulating inorganic oxide layers.

Further, as shown in FIG. 14, the transparent and electrically insulating inorganic oxide layer 12 may be composed of two layers, an upper inorganic oxide layer and a lower inorganic oxide layer so that elution of inorganic ions from the lower inorganic oxide layer (for example, soda-lime glass) is restrained by the upper inorganic oxide layer to protect the organic EL device from the eluted ions.

The thickness of the transparent and electrically insulating inorganic oxide layer 12 is defined in a range of from 0.01 μm to 200 μm. If the thickness of the transparent and electrically insulating inorganic oxide layer is not larger than 0.01 μm, it is near that of a monolayer of an inorganic oxide particle and hence deteriorative gas generated from organic compounds of the lower fluorescent layer, protective layer, and the like never cut.

On the other hand, if the thickness of the transparent and electrically insulating layer exceeds 200 μm, the light emitted from the organic EL device leaks from the gap between the inorganic oxide layer and the fluorescent layers 3R, 3G so that the angle of view for multi-color light emission narrows, leading to a reduction in practicability, although this depends on the fineness of the fluorescent layers 3R and 3G.

The multi-color light emission apparatus of the second invention and the process of the third invention for manufacturing same in the present application are now illustrated for every structural element in detail. Materials used for the structural elements are not limited to the essential materials illustrated in the following descriptions. Also, details common with those in the first invention are omitted as far as possible to avoid redundancies.

1. Organic EL Device

The organic EL device of this invention is similar to that used in the first invention.

(a) Anode

Materials similar to those used in the first invention can be used as the materials for the anode.

(b) Emitting layer

Materials similar to those used in the first invention can be used as the materials for an emitting layer.

(c) Positive hole injecting layer

Materials to those used in the first invention can be used as the materials for a positive hole injecting layer.

(d) Electron Injecting Layer

Materials similar to those used in the first invention can be used as the materials for an electron injecting layer.

(e) Cathode

Materials similar to those used in the first invention can be used as the materials for a cathode.

(f) Manufacture of Organic EL Device(example)

The organic EL device used in this invention can be manufactured in the same manner as in the first invention.

2. Transparent Support Substrate

A transparent support substrate used in the present invention is preferably a transparent material (visible light transmittance of 50% or more) such as, for example, a glass plate, plastic plate (polycarbonate, acryl, or the like), plastic film (polyethylene terephthalate, polyether sulfide, or the like), quartz plate, or the like. There are no limitations as to the thickness of the support substrate to the extent that it can reinforce a thin transparent glass plate to be laminated subsequently without camber and distortion.

3. Fluorescent Layer

Materials similar to those used in the first invention can be used as the materials for a fluorescent layer.

4. Transparent and Electrically Insulating Inorganic Oxide Layer

A transparent and electrically insulating inorganic oxide layer used in the present invention can be formed by laminating it on the fluorescent layer, or a protective layer of the fluorescent layers or transparent adhesive layer, such as described below, for example, by vapor deposition, sputtering, dipping, spin-coating, roll-coating, casting, anodic oxidation of metal film, or the like.

The transparent and electrically insulating inorganic oxide layer may be formed of either one layer or two layers. With the two layer structure composed of an upper inorganic oxide layer and a lower inorganic oxide layer, elution of inorganic ions from the lower inorganic oxide layer (for example, soda-lime glass) is restrained by the upper inorganic oxide layer to protect the organic EL device from the eluted ions.

Examples of the materials used for the transparent and electrically insulating inorganic oxide layer include silicon oxide ($SiO_2$), aluminum oxide ($Al_2O_3$), titanium oxide ($TiO_2$), yttrium oxide ($Y_2O_3$), germanium oxide ($GeO_2$), zinc oxide (ZnO), magnesium oxide (MgO), calcium oxide (CaO), boron oxide ($B_2O_3$), strontium oxide (SrO), barium oxide (BaO), lead oxide (PbO), zirconium oxide ($ZrO_3$), sodium oxide ($Na_2O$), lithium oxide ($Li_2O$), potassium oxide ($K_2O$), and the like. Among these, silicon oxide, aluminum oxide, and titanium oxide are preferable, since the transparency of the layer (film) thereof is high and the film formation temperature is comparatively low (250° C. or less), hence the fluorescent layer or the protective layer deteriorates little.

Also, as the transparent and electrically insulating inorganic oxide layer, it is more preferable to use a glass plate or a glass plate product made by forming a film of one or more compounds selected from a group consisting of silicon oxide, aluminum oxide, titanium oxide, and the like on at least one of the surface or back face of a transparent and insulating glass plate. A low temperature (150° C. or less) operation allowing this glass plate or glass plate product to be applied to the fluorescent layer or the protective layer can be performed so that these layers never entirely deteriorate. Also, the glass plate can especially cut out aqueous vapor, oxygen, deteriorating gases such as monomer gas and the like in an efficient manner.

Compositions of the glass plate are exemplified in Tables 1 and 2. Among these, typical examples are sodalime glass, barium-strontium containing-glass, lead glass, aluminosilicate glass, borosilicate glass, barium borosilicate glass, and the like. Here, the electrically insulating inorganic oxide layer may have a composition containing mainly an inorganic oxide and may contain a nitride (for example, $Si_3N_4$) or fluoride (for example, $CaF_2$) It is preferable that the thickness of the electrically insulating inorganic oxide layer be from 0.01 μm to 200 μm, though there are no limitations as to the thickness to the extent that it acts as an obstacle to the light emission of the organic EL device. The glass plate or the glass plate product made by forming a film of one or more compounds selected from a group consisting of silicon oxide, aluminum oxide, titanium oxide, and the like on at least one of the surface or back face of a transparent and insulating glass plate has preferably a thickness of from 1 μm to 200 μm in consideration of the accuracy and strength of a plate glass.

The reason that inorganic oxide compounds including the glass plate are desired is specifically because electro conductive and transparent inorganic materials such as ITO (indium tin oxides), which are often used, can be adopted as a transparent electrode (anode) of the organic EL device and also because these have excellent mutual affinity and adhesion.

Here, aqueous vapor, oxygen, and gas from organic compounds such as monomers and the like exhibit the problem of a reduction in the light emission life of the organic EL device. Therefore, it is necessary for the transparent and electrically insulating inorganic oxide layer to possess characteristics that do not cause generation of aqueous vapor, oxygen, and gases of organic compounds such as monomers and the like and wherein the external intrusion of these harmful compounds can be prevented.

Specifically, the water content of the inorganic oxide layer is measured by thermal analysis (DTA (Differential Thermal Analysis) and DSC (Differential Scanning Calorimeter)). Also, the gas permeability of the inorganic oxide layer for aqueous vapor and for oxygen is measured according to a test method for permeability of JIS K7126 and the like. If, especially, the water content is 0.1% by weight or less and the gas permeability is $10^{-13}$ cccm/cm$^2$scmHg or less, reduction in the light emission life of the organic EL device, indicated by generation of dark spots can be prevented.

TABLE 1

| | Glass composition type |
|---|---|
| 1) | $R_2O$—R'O—$SiO_2$ |
| | $Na_2O$—CaO/MgO—$SiO_2$ (soda-lime glass) |
| | $Na_2O/K_2O$—BaO/SrO—$SiO_2$ |
| | $Na_2O/K_2O$—CaO/ZnO—$SiO_2$ |
| 2) | $R_2O$—PbO—$SiO_2$ |
| | $K_2O/Na_2O$—PbO—$SiO_2$ (lead glass) |
| 3) | $R_2O$—$B_2O_3$—$SiO_2$ |
| | $Na_2O$—$B_2O_3$—$SiO_2$ (borosilicate glass) |
| | $K_2O$—$B_2O_3$—$SiO_2$ |
| 4) | R'O—$B_2O_3$—$SiO_2$ |
| | PbO—$B_2O_3$—$SiO_2$ |
| | PbO/ZnO—$B_2O_3$—$SiO_2$ |
| | PbO—$B_2O_3$—$SiO_2$ + filler |
| | ZnO—$B_2O_3$—$SiO_2$ |

TABLE 1-continued

Glass composition type

| | |
|---|---|
| 5) | R'O—$Al_2O_3$—$SiO_2$ |
| | CaO/MgO—$Al_2O_3$—$SiO_2$ (aluminosilicate glass) |
| | MgO—$Al_2O_3$—$SiO_2$ |
| | PbO/ZnO—$Al_2O_3$—$SiO_2$ |
| 6) | $R_2O$—$Al_2O_3$—$SiO_2$ |
| | $Li_2O$—$Al_2O_3$—$SiO_2$ |
| | $Na_2O$—$Al_2O_3$—$SiO_2$ |
| 7) | R'O—$TiO_2$—$SiO_2$ |
| | BaO—$TiO_2$—$SiO_2$ |
| 8) | $R_2O$—$ZrO_2$—$SiO_2$ |
| | $Na_2O/Li_2O$—$ZrO_2$—$SiO_2$ |
| 9) | R'O—$P_2O_5$—$SiO_2$ |
| | CaO—$P_2O_5$—$SiO_2$ |
| 10) | R'O—$SiO_2$ |
| | CaO/BaO/PbO—$SiO_2$ |
| 11) | $SiO_2$ |
| 12) | $R_2O$—R'O—$B_2O_3$ |
| | $Li_2O$—BeO—$B_2O_3$ |
| 13) | R'O—$R''_2O_3$—$B_2O_3$ |
| | CaO/BaO—$Al_2O_3$—$B_2O_3$ |
| | CaO/PbO—$Lu_2O_3$—$B_2O_3$ |
| 14) | $R_2O$—$Al_2O_3$—$P_2O_5$ |
| | $K_2O$—$Al_2O_3$—$P_2O_5$ |
| 15) | R'O—$Al_2O_3$—$P_2O_5$ |
| | BaO/CaO—$Al_2O_3$—$P_2O_5$ |
| | ZnO—$Al_2O_3$—$P_2O_5$ |

R: monovalent element,
R': bivalent element,
R": trivalent element

TABLE 2

| Classification | Composition (shown as a unary system-ternary system) |
|---|---|
| 1 Simple oxide | $SiO_2$, $B_2O_3$, $GeO_2$, $As_2O_3$ |
| 2 Silicate | $Li_2O$—$SiO_2$, $Na_2O$—$SiO_2$, $K_2O$—$SiO_2$ |
| | MgO—$SiO_2$, CaO—$SiO_2$, BaO—$SiO_2$, |
| | PbO—$SiO_2$ |
| | $Na_2O$—CaO—$SiO_2$ |
| | $Al_2O_3$—$SiO_2$ |
| 3 Borate | $Li_2O$—$B_2O_3$, $Na_2O$—$B_2O_3$, $K_2O$—$B_2O_3$ |
| | MgO—$B_2O_3$, CaO—$B_2O_3$, PbO—$B_2O_3$ |
| | $Na_2O$—CaO—$B_2O_3$, ZnO—PbO—$B_2O_3$ |
| | $Al_2O_3$—$B_2O_3$, $SiO_2$—$B_2O_3$ |
| 4 Phosphate | $Li_2O$—$P_2O_5$, $Na_2O$—$P_2O_5$ |
| | MgO—$P_2O_5$, CaO—$P_2O_5$, BaO—$P_2O_5$ |
| | $K_2O$—BaO—$P_2O_5$ |
| | $Al_2O_3$—$P_2O_5$, SiO2—$P_2O_5$, $B_2O_3$—$P_2O_5$ |
| | $V_2O_5$—$P_2O_5$, $Fe_2O_3$—$P_2O_5$, $WO_3$—$P_2O_5$ |
| 5 Germanate glass | $Li_2O$—$GeO_2$, $Na_2O$—$GeO_2$, $K_2O$—$GeO_2$ |
| | $B_2O_3$—$GeO_2$, $SiO_2$—$GeO_2$ |
| 6 Tungstate | $Na_2O$—$WO_3$, $K_2O$—$WO_3$ |
| 7 Molybdate | $Na_2O$—$MoO_3$, $K_2O$—$MoO_3$, $L_2O$—$MoO_3$ |
| 8 Tellurate | $Na_2O$—$TeO_2$ |
| 9 Borosilicate | $Na_2O$—$B_2O_3$—$SiO_2$ |
| 10 Aluminosilicate | $Na_2O$—$Al_2O_3$—$SiO_2$, CaO—$Al_2O_3$—$SiO_2$ |
| 11 Aluminoborate | CaO—$Al_2O_3$—$B_2O_3$, ZnO—$Al_2O_3$—$B_2O_3$ |
| 12 Aluminoborosilicate | $Na_2O$—$Al_2O_3$—$B_2O_3$—$SiO_2$ |
| 13 Fluoride | $BeF_2$, NaF—$BeF_2$ |
| | $ZrF_4$—$BaF_2$—$ThF_4$, $GdF_3$—$BaF_2$—$ZrF_4$ |
| 14 Phosphorus fluoride | $Al(PO_3)_3$—$AlF_3$—NaF—$CaF_2$ |
| 15 Oxyhalogenide | $Ag_2O$—AgI—$P_2O_5$ |
| 16 Oxynitride | MgO—$Al_2O_3$—AlN—$SiO_2$ |

5. Protective Layer of the Fluorescent Layers (transparent flat film)

Materials similar to those of the first invention may be used as a protective layer of the fluorescent layers (transparent flat film).

However, the thickness of the protective layer in the second invention is preferably from 0.5 μm to 100 μm approximately. It is desirable that the thickness of the protective layer be as small as possible to reduce light leakage from the gap between the fluorescent layer and the organic EL device with respect to the light emitted from the organic EL device. However, if the film thickness is too small, no effect of protecting the fluorescent layer can be obtained, depending on the type of adhesive.

6. Transparent Adhesive Layer

It is desirable that a transparent adhesive layer, which is used as required in the present invention, be used in the case of adopting the substrate produced by forming the fluorescent layer (including a color filter, black matrix, and protective layer as required) on the transparent support substrate and also, especially, in the case of adopting a glass plate as the inorganic oxide layer. A material which is transparent (visible transmittance of 50% or more), at least in the portion where the light emitted from the organic EL device is transmitted is preferable as the material used for the transparent adhesive layer.

Specifically given as examples of the adhesive are photocurable or heat-curable adhesives having a reactive vinyl group of an acrylic acid type oligomer and methacrylic acid type oligomer; and moisture-curable adhesives such as 2-cyanoacrylate and the like. Also, heat-curable and chemical-curable type (two liquid mixture type) adhesives such as an epoxy or the like can be used.

An adhesive having a low viscosity (about 100 cp or less) ensures that there is no formation of air bubbles when it is applied and hence uniform application is allowable. However, the low viscosity adhesive dissolves and erodes the fluorescent layer depending on the conditions so that it is necessary to laminate the above protective layer on the fluorescent layer. An adhesive having a high viscosity (about 100 cp or more) is scarcely dissolved, and erodes the fluorescent layer so that there is the case where the protective layer of the fluorescent layers is not required. On the contrary, this causes formation of air bubbles, hence uniform application can be achieved only with difficulty. The necessity of providing the protective layer of the fluorescent layers may be determined according to the characteristics of the adhesive.

The adhesive is applied on a substrate, on which the fluorescent layer (including a color filter, black matrix, and protective layer as required) is formed to form a film by spin-coating, roll coating, casting, or the like. Then, a glass plate, on which the transparent electrode has been formed or is to be formed, or a glass plate product made by forming a film of one or more compounds selected from a group consisting of silicon oxide, aluminum oxide, titanium oxide, and the like on at least one of the surface or back face of a transparent, insulating glass plate is applied to the substrate through the adhesive film by means of light (UV rays), heat (up to 150° C.), chemical mixing, or the like according to the specification of the adhesive.

It is preferable that the thickness of the adhesive layer be in the order of 0.1 μm to 200 μm. It is desirable that the thickness of the protective layer be as small as possible to reduce light leakage from the gap between the fluorescent layer and the organic EL device with respect to the light emitted from the organic EL device, thereby improving the characteristics of the angle of view. However, if the film thickness is too small, there is the case where uniform application can be attained only with difficulty due to unevenness between the fluorescent layers.

7. Color Filter and Black Matrix

A color filter and a black matrix used as required in the present invention are formed, for example, by appropriately patterning desired positions of a material selected from known materials by photolithography or printing.

8. Action of the Present Invention

In the present invention with the above structure, the inorganic oxide layer with a thickness of from 0.01 to 200 μm cuts out aqueous vapor, oxygen, or gaseous substances such as organic monomers, which are considered to adhere to or to be contained originally in small amounts in organic compounds forming the lower fluorescent layer or the protective layer of the fluorescent layers or which are considered to be generated by the fluorescent layer or the protective layer by heat when the organic EL device emits light. Hence, the causes of deterioration of the organic EL device can be reduced. Especially in the case of using a glass plate as the inorganic oxide layer, such deteriorative gaseous substances can be prevented to a high degree, resulting in improvement in storage stability and in the light emission life of the multi-color light emission apparatus.

Also, the film thickness of the inorganic oxide layer is 200 μm or less in the present invention, so that undesirable light emission caused by absorption of the light emitted from the organic EL device by a fluorescent layer other than the desired fluorescent layer and light leakage from the gap between the fluorescent layer and the organic EL device decrease, hence light of a desired color could be produced, resulting in improvement in the characteristics of the angle of view for multi-color light emission.

Also, the inorganic oxide layer and the transparent electrode (usually composed of ITO (indium or tin oxide) provide a higher quality adhesion than those composed of organic compounds, thereby facilitating the patterning (usually by photolithography) of the transparent electrode.

Also, in the present invention, the transparent adhesive layer is placed on the boundary of the inorganic oxide layer on the side of the fluorescent layer. Especially in the case where the inorganic oxide layer located at the boundary of the transparent electrode of the organic EL device on the side of the fluorescent layer is composed of a glass plate, adhesion between the organic EL device and the fluorescent layer is enhanced and the organic EL device and the fluorescent layer are integrated. Further, when the transparent protective layer of the fluorescent layers is arranged between the adhesive layer and the fluorescent layer, the fluorescent layer is protected from being dissolved and eroded by the adhesive layer. The protective layer ensures that the uneven film thickness of the fluorescent layers to be separately disposed on the same plane is moderated, the deformation of the inorganic oxide layer on the fluorescent layer is reduced, and defects such as cracking and the like in the inorganic oxide layer or the transparent electrode decrease.

If a thin glass plate with a thickness of from 1 μm to 200 μm is used as the inorganic oxide layer, it is difficult to form an organic electroluminescent device directly on the glass plate in a stable manner since the thin film-glass plate which is physically fragile tends to be cambered and distorted. However, in the process of the present invention, this thin glass plate is combined with the transparent support substrate on which the fluorescent layer and the protective layer of the fluorescent layers are laminated via the adhesive layer. Also, the organic electroluminescence devices are laminated in order, so that the multi-color light emission apparatus can be produced in a stable manner.

EXAMPLES

The present invention will be explained in more detail by way of examples, which are not intended to be limiting of the present invention.

Example 1

An methacrylate type resist containing carbon black (CK 2000, manufactured by Fuji Hunt Electronics Technology Co., Ltd.) was applied by spin-coating to one the faces of a support substrate (Glass 7059, manufactured by Corning Co., Ltd.) with dimensions of 25 mm×75 mm×1.1 mm (thickness), which was baked at 200° C. to form a black film (about 2 μm thickness).

Next, the face opposite to the black film of this substrate was washed with IPA and further irradiated with UV light. Then, the substrate was secured to a substrate holder of a vapor deposition unit (manufactured by ULVAC Corporation). As materials for vapor deposition, MTDATA and NPD for a positive hole injecting layer, DPVBi for an emitting material, and Alq for an electron injecting layer were placed in a resistance heating molybdenum boat. Ag was attached to a tungsten filament as a second metal for an electrode (cathode), and Mg was attached to the molybdenum boat as an electron injecting metal for an electrode (cathode).

After that, the pressure in a vacuum vessel was reduced to $5 \times 10^{-7}$ torr and then the above materials were sequentially laminated in the following order through a mask which enabled film to be formed in a range of 10 mm×60 mm. A vacuum was maintained during the steps between a step of forming electrodes and a step of forming the positive hole injecting layer by one evacuating operation.

First, Mg and Ag were vapor-deposited as the electrode simultaneously at vapor deposition rates of 1.3–1.4 nm/s and 0.1 nm/s respectively to a film thickness of 200 nm. Then, an electron injecting layer was formed by depositing Alq at a vapor deposition rate of 0.1–0.3 nm/s to a film thickness of 20 nm. Next, an emitting layer was formed by depositing DPVBi at a vapor deposition rate of 0.1–0.3 nm/s to a film thickness of 50 nm. Finally, a positive hole injecting layer was formed by depositing NPD at a vapor deposition rate of 0.1–0.3 nm/s to a film thickness of 20 nm and also depositing MTDATA at a vapor deposition rate of 0.1–0.3 nm/s to a film thickness of 200 nm.

Next, the substrate was transferred to a sputtering apparatus. A transparent electrode (anode) film of ITO (indium oxide or tin oxide) with a thickness of 120 nm and a surface resistance of 20 Ω/□ was formed on this substrate at room temperature through a mask which enabled a film to be formed of an area of 10 mm×60 mm to create an organic EL device. Here, the mask was lifted so that the ranges of the electrodes and transparent electrode were crossed (in a range of 10 mm×55 mm) and the terminal of each electrode could be taken.

Next, an epoxy, two-liquid mixing type adhesive (Araldite, manufactured by Ciba Geigy Co., Ltd.) was applied to the peripheries of the crossed portions (10 mm×55 mm) at a width of 1 mm approximately with partial slits using a dispenser to form a substrate A.

Then, a transparent inorganic oxide substrate (barium borosilicate glass) (substrate B) of 25 mm×75 mm×1.1 mm (thickness) was applied to the substrate A and the adhesive was cured. After that, hydrocarbon fluoride (Fluorinert, manufactured by Sumitomo 3M Corp.) was injected under a nitrogen atmosphere, using an injection needle, through the above slits into gaps between the support substrate (substrate A.) and the applied substrate (substrate B). Then, the same adhesive was filled into the slits in the cured adhesive and cured.

Next, characters EL with a width of 1 mm were printed on the substrate within the portion corresponding to the crossed portion (a range of 10 mm×55 mm) through a screen board using an ink (viscosity 8,000 cp) produced by dissolving coumarin 6/polyvinyl chloride resin (molecular weight of 20,000) in cyclohexanone in the coumarin 6 concentration of 0.03 mol/kg (film). The characters were air-dried to prepare a fluorescent pattern of the characters EL (15 μm thickness).

A multi-color light emission apparatus composed of the organic EL device was manufactured in this manner as shown in FIG. 1. When a d.c. voltage of 8 V was applied between the transparent electrode (anode) and the electrode (cathode) of the multi-color light emission apparatus, the crossed portions of the transparent electrodes (anodes) and the electrodes (cathodes) emitted light. The luminance of the light viewed from the portion lacking the fluorescent layer was 100 cd/m$^2$. The CIE chromaticity coordinates (JIS Z 8701) were as follows: x=0.15, y=0.15. Light of a blue color was detected.

Also, the luminance of the light viewed from the fluorescent layer provided with the patterned characters EL was 120 cd/m$^2$ and the CIE chromaticity coordinates were as follows: x=0.28, y=0.62. Light of a yellowish green color was detected.

The multi-color light emission apparatus was allowed to stand in the atmosphere for two weeks. As a result, the multi-color light emission apparatus maintained uniform light emission without changes in luminance and chromaticity and also without dark spots appearing as deterioration of the device progressed.

Example 2

A support substrate (substrate A) provided with an organic EL device was combined with a transparent inorganic oxide substrate (substrate B) in the same manner as in Example 1 to form a substrate containing a gap filled with hydrocarbon fluoride. Next, the characters EL with a width of 1 mm were printed on the substrate within the portion corresponding to the crossed portion (range 10 mm×55 mm) of an electrode and a transparent electrode through a screen board using an ink (viscosity 8,000 cp) produced by dissolving 43% (for film) by weight of a pigment containing rhodamine/polyvinyl chloride resin (molecular weight 20,000) in cyclohexanone. The characters were air-dried to prepare a fluorescent pattern of the characters EL (20 μm thickness).

A multi-color light emission apparatus composed of the organic EL device was manufactured in this manner as shown in FIG. 1. When a d.c. voltage of 8 V was applied between the transparent electrode (anode) and the electrode (cathode) of the multi-color light emission apparatus, the crossed portions of the transparent electrodes and the electrodes emitted light. The luminance of the light viewed from the portion lacking the fluorescent layer was 100 cd/m$^2$. The CIE chromaticity coordinate (JIS Z 8701) was as follows: x=0.15, y=0.15. Light of a blue color was detected.

Also, the luminance of the light viewed from the fluorescent layer provided with the patterned characters EL was 30 cd/m$^2$ and the CIE chromaticity coordinates were as follows: x=0.60, y=0.31. Light of a red color was detected.

The multi-color light emission apparatus was allowed to stand in the atmosphere for two weeks. As a result, the multi-color light emission apparatus maintained uniform light emission without changes in luminance and chromaticity coordinate and also without dark spots appearing as deterioration of the device progressed.

Example 3

An methacrylate type resist containing carbon black (CK 2000, manufactured by Fuji Hunt Electronics Technology Co., Ltd.) was applied by spin-coating to one face of a support substrate (Glass 7059, manufactured by Corning Co., Ltd.) of 100 mm×100 mm×1.1 mm (thickness), which was baked at 200° C. to form a black film with a thickness of about 2 μm.

Next, the face opposite to the black film of this substrate was washed with IPA and further irradiated with UV light. Then, the substrate was secured to a substrate holder of a vapor deposition unit (manufactured by ULVAC Corporation). As materials for vapor deposition, MTDATA and NPD for a positive hole injecting layer, DPVBi for a emitting material, and Alq for an electron injecting layer were placed in a resistance heating molybdenum boat. Ag as a second metal for an electrode (cathode) was attached to a tungsten filament, and Mg as an electron injecting metal for an electrode (cathode) was attached to the molybdenum boat.

After that, the pressure in a vacuum vessel was reduced to 5×10$^{-7}$ torr. First, a film with a pattern of an electrode was formed using a mask capable of transferring a stripe pattern of an 1.5 mm pitch (1.4 mm lines and 0.1 mm gaps) in a range of 72 mm×72 mm. Next, films of layers from an electron injecting layer to a positive hole injecting layer were formed using a mask enabling a film to be formed in a range of 72 mm×72 mm. A vacuum was maintained during the steps between the step of forming the electrodes and the step of forming the positive hole injecting layer by one evacuating operation.

First, Mg and Ag were simultaneously vapor-deposited as the electrodes at vapor deposition rates of 1.3–1.4 nm/s and 0.1 nm/s respectively to a film thickness of 200 nm. Then, an electron injecting layer was formed by depositing Alq at a vapor deposition rate of 0.1–0.3 nm/s to a film thickness of 20 nm. Next, an emitting layer was formed by depositing DPVBi at a vapor deposition rate of 0.1–0.3 nm/s to a film thickness of 50 nm. Finally, a positive hole injecting layer was formed by depositing NPD at a vapor deposition rate of 0.1–0.3 nm/s to a film thickness of 20 nm and also depositing MTDATA at a vapor deposition rate of 0.1–0.3 nm/s to a film thickness of 400 nm.

Next, the substrate was transferred to a sputtering apparatus. A film of a transparent electrode (anode) of ITO with a thickness of 120 nm and a surface resistance of 20 Ω/□ was formed on this substrate at room temperature through a mask which enabled a solid film with a stripe pattern of 4.5 mm pitch (4.0 mm lines, 1.0 mm gaps) to be formed in a range of 72 mm×72 mm, to form an organic EL device. Here, the mask was located so that the ranges of the electrodes and transparent electrodes were crossed and the terminal of each electrode could be taken.

Next, an epoxy, two-liquid mixing type adhesive (Araldite, manufactured by Ciba Geigy Co., Ltd.) was applied to the peripheries of the crossed portions (a range of 72 mm×72 mm) at a width of 1 mm approximately with partial slits using a dispenser to form a substrate C.

Then, a transparent inorganic oxide substrate (barium borosilicate glass) (substrate D) of 100 mm×100 mm×0.15 mm was applied to the substrate C and the adhesive was cured. After that, hydrocarbon fluoride (Fluorinert, manufactured by Sumitomo 3M Corp.) was injected under a nitrogen atmosphere, using an injection needle, through the above slits into a gap between the support substrate (substrate C) and the applied substrate (substrate D). Then, the same adhesive was filled into the slits in the cured adhesive and cured.

Next, a pattern of a fluorescent layer A with a thickness of 15 μm was printed by screen printing on the substrate using an ink (viscosity 8,000 cp) produced by dissolving coumarin 6/polyvinyl chloride resin (molecular weight 20,000) in cyclohexanone in the coumarin 6 concentration of 0.03 mol/kg (film) through a screen board which enabled a stripe pattern of 1.4 mm lines and 3.1 mm gaps to be formed after aligning with the electrodes (cathodes) of the organic EL device, followed by air-drying.

Next, a pattern of a fluorescent layer B with a thickness of 20 μm was printed by screen printing on the substrate using an ink (viscosity 8,000 cp) produced by dissolving 43% (for film) by weight of a pigment containing rhodamine/polyvinyl chloride resin (molecular weight 20,000) in cyclohexanone through a screen board which enabled a stripe pattern of 1.4 mm lines and 3.1 mm gaps to be formed after lifting the pattern 1.5 mm from the pattern of the fluorescent layer A in a direction perpendicular to the stripe, followed by air-drying.

A multi-color light emission apparatus composed of the organic EL device (dot matrix type) was manufactured in this manner as shown in FIG. 4. When a d.c. voltage of 8 V was applied between the anode and the cathode of the multi-color light emission apparatus, the crossed portions of the transparent electrodes (anodes) and the electrodes (cathodes) emitted light. The luminance of the light viewed from the portion lacking the fluorescent layer was 100 cd/m$^2$. The CIE chromaticity coordinate (JIS Z 8701) was as follows: x=0.15, y=0.15. Light of a blue color was detected.

Also, the luminance of the light viewed from the fluorescent layer A was 120 cd/m$^2$ and the CIE chromaticity coordinates were as follows: x=0.28, y=0.62. Light of a yellowish green color was detected.

On the other hand, the luminance of the light viewed from the fluorescent layer B was 30 cd/m$^2$ and the CIE chromaticity coordinates were as follows: x=0.60, y=0.31. Light of a red color was detected.

The multi-color light emission apparatus was allowed to stand in the atmosphere for two weeks. As a result, the multi-color light emission apparatus maintained uniform light emission without changes in luminance and chromaticity coordinate and also without dark spots appearing as deterioration of the device progressed. Also, the angle of view defined by the range in which leakage of light (monochromatic light) was not confirmed was ±60° which was a practical level.

Example 4

A coating agent composed of an aqueous polyvinyl pyrrolidone (molecular weight 360,000) solution was applied by spin-coating on the fluorescent layer of the multi-color light emission apparatus composed of the organic EL device manufactured in Example 1 and air-dried to laminate a protective layer of the fluorescent layers with a thickness of 10 μm.

A multi-color light emission apparatus composed of the organic EL device was manufactured in this manner as shown in FIG. 2. The multi-color light emission apparatus was allowed to stand in the atmosphere for two weeks. As a result, the multi-color light emission apparatus maintained uniform light emission without changes in luminance and chromaticity coordinates and also without dark spots appearing as deterioration of the device progressed.

Also, because the protective layer was laminated, the fluorescent layer was never damaged even if the fluorescent layer was contacted by a nail and the handling, such as carrying, of the apparatus was easy.

Example 5

An adhesive was applied to a substrate produced by forming an organic EL device on a support substrate in the same manner as in Example 3 to form a substrate X.

Separately, a pattern of a fluorescent layer A with a thickness of 15 μm was printed by screen printing on a transparent substrate (7059, manufactured by Corning Co., Ltd.) of 100 mm×100 mm×0.70 mm (thickness) using an ink (viscosity 8,000 cp) produced by dissolving coumarin 6/polyvinyl chloride resin (molecular weight 20,000) in cyclohexanone in the coumarin 6 concentration of 0.03 mol/kg (film) through a screen board which enabled a stripe pattern of 1.4 mm lines and 3.1 mm gaps to be formed after aligning with the location corresponding to electrodes of the organic EL device, followed by baking at 120° C.

Next, a pattern of a fluorescent layer B with a thickness of 20 μm was printed by screen printing on the substrate using an ink (viscosity 8,000 cp) produced by dissolving 43% (for film) by weight of a pigment containing rhodamine/polyvinyl chloride resin (molecular weight 20,000) in cyclohexanone through a screen board which enabled a stripe pattern of 1.4 mm lines and 3.1 mm gaps to be formed after lifting the pattern 1.5 mm from the pattern of the fluorescent layer A in a direction perpendicular to the stripe, followed by baking at 120° C.

An aqueous polyvinyl pyrrolidone (molecular weight 360,000) solution was applied by spin-coating to the substrate to laminate a protective layer of the fluorescent layers with a thickness of 10 μm. Next, 2-cyanoacrylate type adhesive (*Aron α, manufactured by Toagosei Chemical Industry Co., Ltd.) was applied to the entire substrate by casting to provide an inorganic oxide substrate (aluminoborosilicate glass) of 100 mm×100 mm×0.05 mm (thickness) on the substrate to form a substrate Y.

The substrate Y was applied to the above substrate X so that a 0.05 mm thickness substrate of the substrate Y faced the organic EL device and the fluorescent layers A and B were aligned with the electrodes of the organic EL device and the adhesive was cured. After that, hydrocarbon fluoride (Fluorinate, manufactured by Sumitomo 3M Corp.) was injected under a nitrogen atmosphere using an injection needle, through slits in the cured adhesive into a gap between the support substrate (substrate X) and the applied substrate (substrate Y). Then, the same adhesive was filled into the slits in the cured adhesive and cured.

Figure 6:
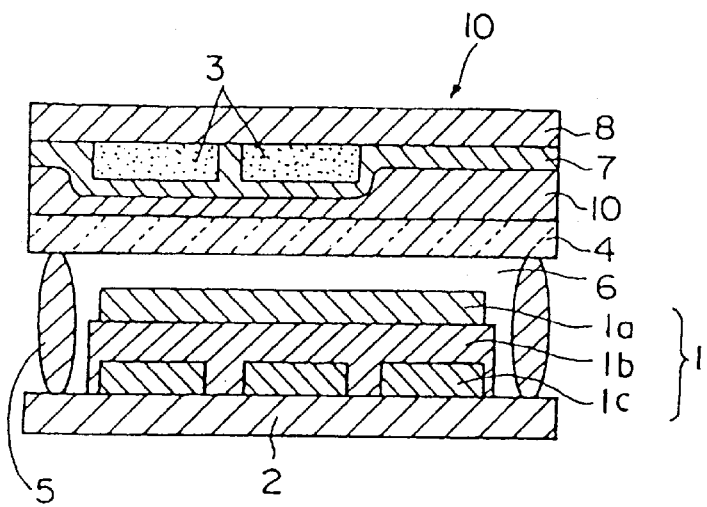
FIG. 6 is a schematic and typical cross section of the multi-color light emission apparatus (first invention) of the present invention showing an other embodiment using a protective layer of the fluorescent layers and a transparent substrate.

The luminance and chromaticity coordinate of the light emitted in the multi-color light emission apparatus, composed of the organic EL device shown in FIG. 6 and designated as apparatus 10, which was manufactured in this manner, were the same as those in Example 3. Even if the multi-color light emission apparatus was allowed to stand in the atmosphere for two weeks, the multi-color light emission apparatus maintained uniform light emission without changes in luminance and chromaticity coordinate and also without dark spots as deterioration of the device progressed. Also, the angle of view defined by the range in which leakage of light (mono-chromatic light) emitted from the organic electroluminescence device was not confirmed was ±70° which was a practical level.

Also, because the transparent substrate was laminated, the fluorescent layer was never damaged even if the fluorescent layer was contacted by a nail and the handling, such as carrying of the apparatus, was easy.

Comparative Example 1

First, a substrate A was manufactured in the same manner as in Example 1.

Next, characters EL with a width of 1 mm were printed on the transparent substrate with dimension of 25 mm×75 mm×1.1 mm (thickness) within the portion corresponding to the crossed portion (a range of 10 mm×55 mm) of an electrode and a transparent electrode through a screen board using an ink (viscosity 8,000 cp) produced by dissolving coumarin 6/polyvinyl chloride resin (molecular weight 20,000) in cyclohexanone in the coumarine 6 concentration of 0.03 mol/kg (film). The characters were air-dried to prepare a fluorescent pattern of the characters EL to form a substrate E.

The substrate E was applied to the above substrate A so that the fluorescent layer of the substrate E faced the organic EL device and the adhesive was cured. After that, hydrocarbon fluoride (Fluorinert, manufactured by Sumitomo 3M Corp.) was injected under a nitrogen atmosphere using an injection needle, through slits in the cured adhesive into a gap between the support substrate (substrate A) and the applied substrate (substrate E). Then, the same adhesive was filled into the slits in the cured adhesive and cured.

Figure 7:
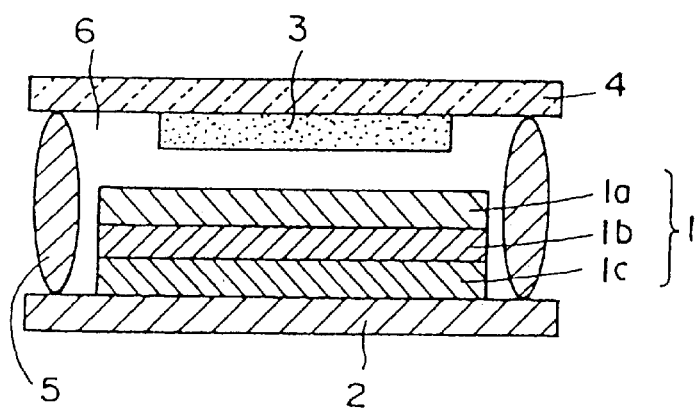
FIG. 7 is a schematic and typical cross section of a comparative example, relative to the first invention, wherein a fluorescent layer is disposed in the same side as an organic EL device on a transparent glass substrate.
Figure 8:
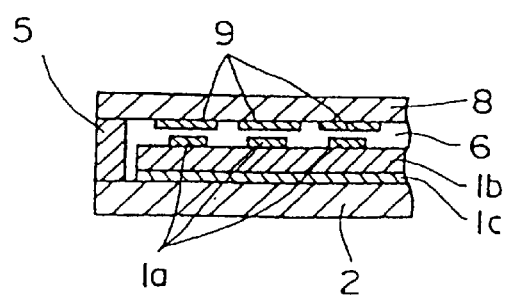
FIG. 8 is a schematic and typical cross section of an example of a conventional multi-color light emission apparatus.

A multi-color light emission apparatus composed of the organic EL device was manufactured in this manner as shown in FIG. 7. When a d.c. voltage of 8 V was applied between the transparent electrode (anode) and the electrode (cathode) of the multi-color light emission apparatus, the crossed portions of the transparent electrodes and the electrodes emitted light. The luminance and chromaticity coordinates of each light viewed from the portion lacking the fluorescent layer and from the characters EL were the same as those in Example 1.

However, when the multi-color light emission apparatus was allowed to stand in the atmosphere for two weeks, the luminance of the blue light emitting portion decreased to 5 cd/m$^2$ and the luminance of the light viewed from the characters EL decreased to 7 cd/m$^2$. Also, dark spots, appearing as deterioration of the device progressed, increased, resulting in nonuniform light emission. It was confirmed that when the fluorescent layer is disposed so as to face the organic EL device contrary to Example 1, the light emission life of the multi-color light emission apparatus was greatly impaired.

Comparative Example 2

A substrate C was manufactured in the same manner as in Example 3.

A transparent inorganic oxide substrate (borosilicate glass) (substrate F) of 100 mm×100 mm×0.30 mm thickness was applied to the above substrate C. Then, a multi-color light emission apparatus composed of an organic EL device (dot matrix type) shown in FIG. 4 was formed in the same manner as in Example 3.

This multi-color light emission apparatus was allowed to emit light to result in obtaining the same luminance and chromaticity as in Example 3.

When the multi-color light emission apparatus was allowed to stand in the atmosphere for two weeks, the multi-color light emission apparatus maintained uniform light emission without changes in luminance and chromaticity coordinates and also without dark spots appearing as deterioration of the device progressed. However, the angle of view defined by the range in which leakage of light (mono-chromatic light) emitted from the organic electroluminescence device was not confirmed was ±30°, so that there were portions (angles) where the light color viewed from a normal sight range differed from the emitted light color, exhibiting a problem in practical use.

Example 6

A pattern of a fluorescent layer A with a thickness of 15 µm was printed by screen printing on a glass substrate (7059, manufactured by Corning Co., Ltd.) of 100 mm×100 mm×1.1 mm (thickness) as a transparent support substrate using an ink (viscosity 8,000 cp) produced by dissolving coumarin 6/polyvinyl chloride resin (molecular weight 20,000) in cyclohexanone in the coumarin 6 concentration of 0.03 mol/kg (film) through a screen board which enabled a stripe pattern of 1.4 mm lines and 3.1 mm gaps to be formed, followed by baking at 120° C. Next, a pattern of a fluorescent layer B with a thickness of 20 µm were printed by screen printing on the substrate using an ink (viscosity 8,000 cp) produced by dissolving 43% (for film) by weight of a pigment containing rhodamine/polyvinyl chloride resin (molecular weight 20,000) in cyclohexanone through a screen board which enabled a stripe pattern of 1.4 mm lines and 3.1 mm gaps to be formed after lifting the pattern 1.5 mm from the pattern of the fluorescent layer A in a direction perpendicular to the stripe, followed by baking at 120° C.

An aqueous solution of 20% by weight of polyvinyl alcohol (molecular weight 50,000) was applied to the entire substrate provided with the patterns of the fluorescent layers by spin-coating. The substrate was baked at 80° C. to prepare a transparent protective layer of the fluorescent layers with a thickness of 5 µm.

Next, a photocurable transparent adhesive of epoxy type oligomer (3102, manufactured by Three Bond corp.) was applied to the protective layer by casting. The glass surface of a glass plate (borosilicate glass) of 100 mm×100 mm×50 µm thickness as an insulating inorganic oxide layer, on which a film of a transparent electrode (anode) of ITO (indium oxide or tin oxide) with a thickness of 0.12 µm and a surface resistance of 20 Ω/□ was formed, was applied to the protective layer. The substrate was irradiated with UV light through the ITO surface at a dose of 3,000 mJ/cm$^2$ (365 nm), followed by baking at 80° C.

A film of a novolak/quinonediazido type positive resist (HPR 204, manufactured by Fuji Hunt Electronics Technology Co., Ltd.) was laminated by spin-coating. After baking at 80° C., the substrate was placed on a proximity type exposure machine. Then, the substrate was irradiated with light at a dose of 100 mJ/cm$^2$ (365 nm) using a mask capable of transferring a stripe pattern of 1.2 mm lines and 0.3 mm gaps after aligning the mask with the fluorescent layers A and B.

The resist on the substrate was developed using an aqueous solution of 2.38% by weight of TMAH (Tetra-Methyl Ammonium Hydroxide) and post-baked at 130° C. Then, the exposed ITO film was treated by etching using aqueous hydrobromic acid and, finally, the positive type resist was peeled off to prepare a pattern of the ITO film which constitutes an anode of the organic EL device.

Next, this substrate was washed with IPA and further irradiated with UV light. Then, the substrate was secured to a substrate holder of a vapor deposition unit (manufactured by ULVAC Corporation). As materials for vapor deposition, MTDATA and NPD for a positive hole injecting layer, DPVBi for anemittingmaterial, andAlq for an electron injecting layer, were placed in a resistance heating molybdenum boat. Ag as a second metal for an electrode (cathode) was attached to a tungsten filament, and Mg as an electron injecting metal for an electrode (cathode) was attached to the molybdenum boat.

After that, the pressure in a vacuum vessel was reduced to 5×10$^{-7}$ torr and then the above materials were sequentially laminated in the following order. A vacuum was maintained during the steps between the step of forming the positive hole injecting layer and the step of forming the cathode by one evacuating operation. First, a positive hole injecting layer was formed by depositing MTDATA at a vapor deposition rate of 0.1–0.3 nm/s to a film thickness of 200 nm and also depositing NPD at a vapor deposition rate of 0.1–0.3 nm/s to a film thickness of 20 nm. Next, an emitting layer was formed by depositing DPVBi at a vapor deposition rate of 0.1–0.3 nm/s to a film thickness of 50 nm. Then, an electron injecting layer was formed by depositing Alq at a vapor deposition rate of 0.1–0.3 nm/s to a film thickness of 20 nm. Finally, Mg and Ag were vapor-deposited simultaneously as the cathode at vapor deposition rates of 1.3–1.4 nm/s and 0.1 nm/s respectively to a film thickness of 200 nm through a mask capable of transferring a stripe pattern of 4 mm lines and 0.5 mm gaps which is perpendicular to the stripe pattern of the anode composed of ITO.

Figure 11:
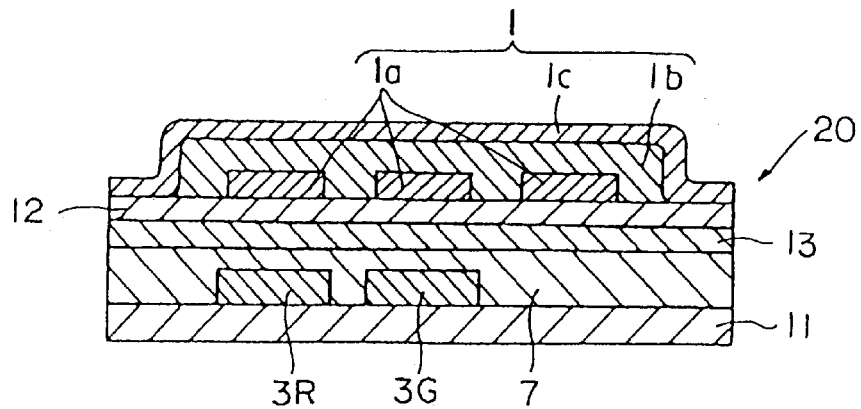
FIG. 11 is a schematic and typical cross section of the multi-color light emission apparatus (second invention) of the present invention showing a further embodiment using a transparent adhesive layer and a transparent protective layer of the fluorescent layers.

A multi-color light emission apparatus composed of the organic EL device was manufactured in this manner as shown in FIG. 11. When a d.c. voltage of 8 V was applied between the anode and the cathode of the multi-color light emission apparatus, the crossed portions of the anodes and cathodes emitted light. The luminance of the light viewed from the portion lacking the fluorescent layer was 100 cd/m$^2$. The CIE chromaticity coordinate (JIS Z 8701) was as follows: x=0.15, y=0.15. Light of a blue color was detected.

On the other hand, the luminance of the light viewed from the fluorescent layer A was 120 cd/m$^2$ and the CIE chromaticity coordinates were as follows: x=0.28, y=0.62. Light of a yellowish green color was detected.

Also, the luminance of the light viewed from the fluorescent layer B was 30 cd/m$^2$ and the CIE chromaticity coordinates were as follows: x=0.60, y=0.31. Light of a red color was detected.

The multi-color light emission apparatus manufactured in the above manner was allowed to stand under a nitrogen stream for two weeks. As a result, the multi-color light emission apparatus maintained uniform light emission without changes in luminance and chromaticity coordinates and also without dark spots appearing as deterioration of the device progressed. Also, the angle of view defined by the range in which leakage of light (mono-chromatic light) emitted from the organic EL device was not confirmed was 60°, which was a practical level.

The water content of the glass substrate with a thickness of 50 μm was 0.1% by weight or less and the gas permeability of the glass substrate for aqueous vapor and for oxygen was $10^{-13}$ cccm/cm$^2$scmHg or less.

Example 7

A photocurable transparent adhesive of epoxy type oligomer (3112, manufactured by Three Bond corp.) was applied, by casting, to the substrate provided with the fluorescent layers A and B, which was prepared in Example 6. The glass surface of a glass plate (borosilicate glass) of 100 mm×100 mm×50 μm thickness as an insulating inorganic oxide layer on which a film of a transparent electrode (anode) of ITO with a thickness of 0.12 μm and a surface resistance of 20 Ω/□ was formed was applied to the substrate. The substrate was irradiated with UV rays through the surface of ITO at a dose of 3,000 mJ/cm$^2$ (365 nm), followed by baking at 80° C.

Figure 10:
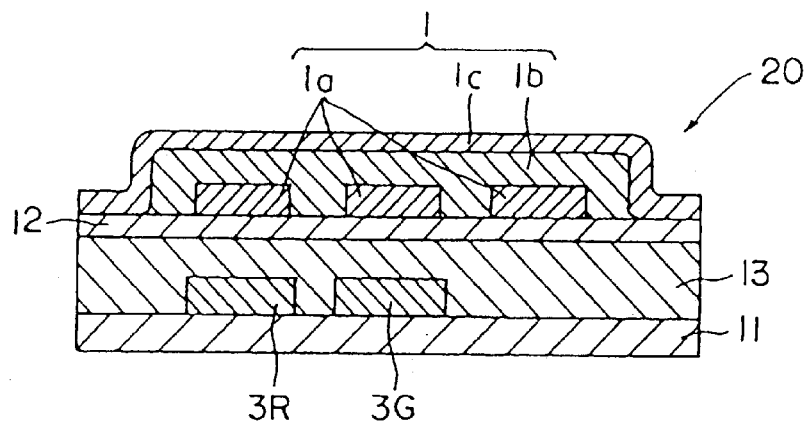
FIG. 10 is a schematic and typical cross section of the multi-color light emission apparatus (second invention) of the present invention showing another embodiment using a transparent adhesive layer.

Then, the ITO was patterned and an organic EL device was formed under the same conditions as in Example 6 to prepare a multi-color light emission apparatus composed of the organic EL device shown in FIG. 10.

This multi-color light emission apparatus was allowed to emit light to obtain the same luminance and chromaticity coordinates as in Example 6. When the multi-color light emission apparatus was allowed to stand under a nitrogen stream for two weeks, it maintained uniform light emission without changes in luminance and chromaticity coordinate and also without dark spots as deterioration of the device progressed. Also, the angle of view defined by the range in which leakage of light (mono-chromatic light) emitted from the organic electroluminescence device was not confirmed was ±55°, which was a practical level.

Example 8

A photocurable resist containing carbon black (CK 2000, manufactured by Fuji Hunt Electronics Technology Co., Ltd.) was applied by spin-coating to a glass substrate (7059, manufactured by Corning Co., Ltd.) of 100 mm×100 mm×1.1 mm (thickness) as a transparent support substrate, which was baked at 80° C. Then, an oxygen shielding film of polyvinyl alcohol(CP, manufactured by Fuji Hunt Electronics Technology Co., Ltd.) was formed on the substrate by spin-coating, and was baked at 80° C. Next, the resulting substrate was placed on a proximity type exposure machine. The substrate was then irradiated with light at a dose of 100 mJ/cm$^2$ (365 nm) using a mask capable of transferring a stripe pattern of 0.3 mm lines and 1.2 mm gaps. The resist on the substrate was developed using aqueous 1N sodium carbonate solution and post-baked at 200° C. to provide a black matrix.

A photocurable resist containing copper phthalocyanine (CB 2000, manufactured by Fuji Hunt Electronics Technology Co., Ltd.) was applied to the substrate by spin-coating and was baked at 80° C. Then, an oxygen shielding film of polyvinyl alcohol (CP, manufactured by Fuji Hunt Electronics Technology Co., Ltd.) was formed on the substrate by spin-coating and was baked at 80° C. Next, the substrate was placed on a proximity type exposure machine. The substrate was then irradiated with light at a dose of 100 mJ/cm$^2$ (365 nm) using a mask capable of transferring a stripe pattern of 1.4 mm lines and 3.1 mm gaps after aligning the substrate so that the pattern was embedded in gaps of the black matrix. The resist on the substrate was developed using aqueous 1N sodium carbonate solution and post-baked at 200° C. to provide a blue color filter.

Fluorescent layers A and B were printed by screen printing on portions other than the blue color filter of the substrate provided with the black matrix and the blue color filter under the same conditions as in Example 1 after alignment with the gaps of the black matrix. Then, the same glass plate as in Example 1, specifically, a glass plate with a thickness of 50 μm, which was provided with a film of ITO (anode), was applied to the above substrate to form an ITO pattern.

Next, this substrate was washed with IPA and further irradiated with UV light. Then, the substrate was secured to a substrate holder of a vapor deposition unit (manufactured by ULVAC Corporation). As materials for vapor deposition, MTDATA and NPD for a positive hole injecting layer, DPVBi for an emitting material, DPAVB for a dopant, and Alq for an electron injecting layer were placed in a resistance heating molybdenum boat. Ag as a second metal for an electrode (cathode) was attached to a tungsten filament, and Mg as an electron injecting metal for an electrode (cathode) was attached to the molybdenum boat.

After that, the pressure in the vacuum vessel was reduced to 5×10$^{-7}$ torr and the above materials were sequentially laminated in the following order. A vacuum was maintained during the steps between the step of forming the positive hole injecting layer and the step of forming the cathode by one evacuating operation. First, a positive hole injecting layer was formed by depositing MTDATA at a vapor deposition rate of 0.1–0.3 nm/s to a film thickness of 200 nm and also depositing NPD at a vapor deposition rate of 0.1–0.3 nm/s to a film thickness of 20 nm. Then, an emitting layer was formed by depositing DPVBi at a vapor deposition rate of 0.1–0.3 nm/s and also depositing DPAVB at a vapor deposition rate of 0.05 nm/s to a total film thickness of 40 nm (the proportion by weight of dopant to host material was from 1.2 to 1.6). Then, an electron injecting layer was formed by depositing Alq at a vapor deposition rate of 0.1–0.3 nm/s to a film thickness of 20 nm. Finally, Mg and Ag were simultaneously vapor-deposited as the cathode at vapor deposition rates of 1.3–1.4 nm/s and 0.1 nm/s respectively to a film thickness of 200 nm through a mask capable of transferring a stripe pattern of 4 mm lines and 0.5 mm gaps which is perpendicular to the stripe pattern of the ITO anode.

A multi-color light emission apparatus composed of the organic EL device was manufactured in this manner as shown in FIG. 13. When a d.c. voltage of 8 V was applied between the anode and the cathode of the multi-color light emission apparatus, the crossed portions of the anodes and cathodes emitted light. The luminance of the light viewed from the blue color filter was 35 cd/m$^2$. The CIE chromaticity coordinates (JIS Z 8701) were as follows: x=0.14, y=0.12. Light of a blue color was detected.

On the other hand, the luminance of the light viewed from the fluorescent layer A was 120 cd/m$^2$ and the CIE chromaticity coordinates were as follows: x=0.28, y=0.62. Light of a yellowish green color was detected.

Also, the luminance of the light viewed from the fluorescent layer B was 30 cd/m$^2$ and the CIE chromaticity coordinates were as follows: x=0.60, y=0.31. Light of a red color was detected.

The multi-color light emission apparatus manufactured in the above manner was allowed to stand under a nitrogen stream for two weeks. As a result, the multi-color light emission apparatus maintained uniform light emission without changes in luminance and chromaticity coordinate and also without dark spots appearing as deterioration of the device progressed. Also, the angle of view defined by the range in which color mixing was not confirmed when mono-chromatic light was emitted was ±70°, which was a practical level.

Example 9

A methacrylate type photocurable resin (V259PA, manufactured by Nippon Steel Chemical Co., Ltd.) was applied, by spin-coating, to the substrate provided with the fluorescent layers A and B, which was prepared in Example 6. After baking at 80° C., the substrate was irradiated with UV light at a dose of 300 mJ/cm$^2$ (365 nm). Then, the substrate was baked at 160° C. to laminate a transparent protective layer with a thickness of 5 μm.

Next, a silicon oxide film as as insulating inorganic oxide layer with a thickness of 0.01 μm was laminated over the entire substrate heated at 160° C. using a sputtering apparatus. Then, a film of ITO (anode) with a thickness of 0.12 μm and a surface resistance of 20 Ω/□ was formed on the substrate using a sputtering apparatus, while the substrate was heated at 160° C.

Figure 12:
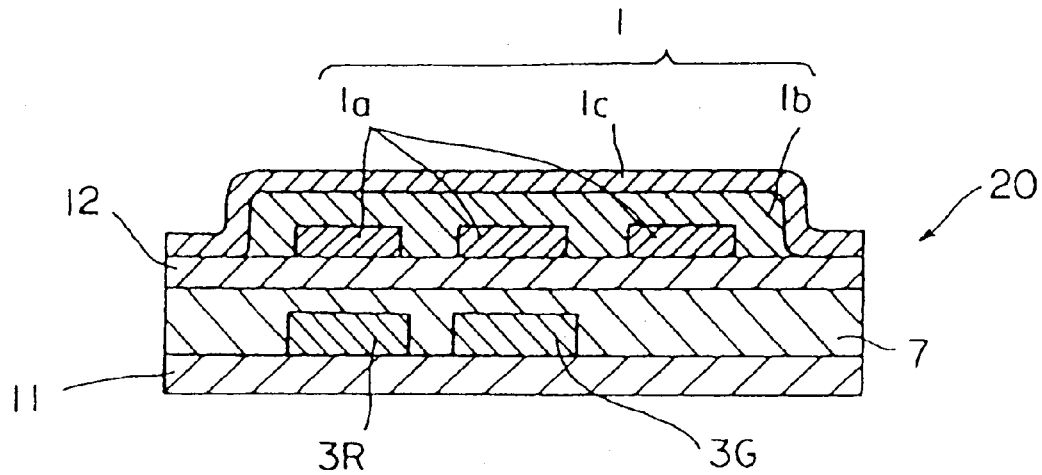
FIG. 12 is a schematic and typical cross section of the multi-color light emission apparatus (second invention) of the present invention showing a still further embodiment using a transparent protective layer of the fluorescent layers.

Then, the ITO was patterned and an organic EL device was formed under the same conditions as in Example 6 to prepare a multi-color light emission apparatus composed of the organic EL device shown in FIG. 12. This multi-color light emission apparatus was allowed to emit light to obtain the same luminance and chromaticity coordinates as in those in Example 6. When the multi-color light emission apparatus was allowed to stand under a nitrogen stream for two weeks, the multi-color light emission apparatus maintained uniform light emission with almost no changes in luminance and chromaticity coordinates and also with few dark spots appearing as deterioration of the device progressed. Also, the angle of view defined by the range in which leakage of light (mono-chromatic light) emitted from the organic electroluminescence device was not confirmed was ±90°, which was a practical level.

The water content of the silicon oxide film with a thickness of 0.01 μm was 0.1% by weight or less and the gas permeability of the silicon oxide film for aqueous vapor and for oxygen was $10^{-13}$ cccm/cm$^2$scmHg or less.

Example 10

An aluminum oxide film as an insulating inorganic oxide layer with a thickness of 0.01 μm was laminated over the entire substrate provided with the fluorescent layers A and B, which was prepared in Example 6, using a sputtering apparatus while heating the substrate at 160° C. Then, a solid film of ITO with a thickness of 0.12 μm and a surface resistance of 20 Ω/□ was formed on the substrate using a sputtering apparatus, while the substrate was heated at 160° C.

Figure 9:
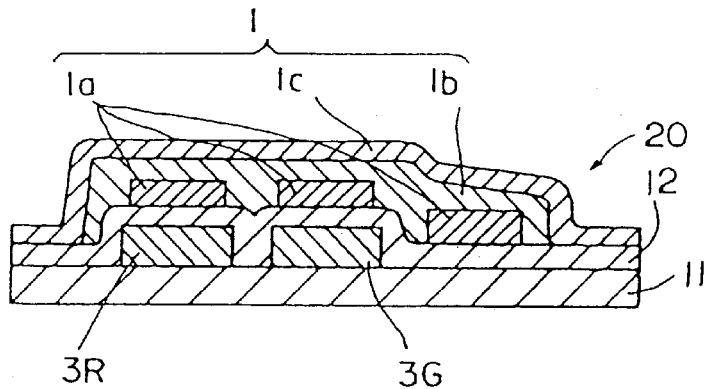
FIG. 9 is a schematic and typical cross section of an embodiment of the multi-color light emission apparatus (second invention) of the present invention.

Then, the ITO was patterned and an organic EL device was formed under the same conditions as in Example 6 to prepare a multi-color light emission apparatus composed of the organic EL device shown in FIG. 9. This multi-color light emission apparatus was allowed to emit light to obtain the same luminance and chromaticity coordinates as in those in Example 6. When the multi-color light emission apparatus was allowed to stand under a nitrogen stream for two weeks, the multi-color light emission apparatus maintained uniform light emission with almost no changes in luminance and chromaticity coordinate and also with few dark spots appearing as deterioration of the device progressed. Also, the angle of view defined by the range in which leakage of light (mono-chromatic light) emitted from the organic electroluminescence device was not confirmed was ±90°, which was a practical level.

The water content of the aluminum oxide film with a thickness of 0.01 μm was 0.1% by weight or less and the gas permeability of the aluminum oxide film for aqueous vapor and for oxygen was $10^{-13}$ cccm/cm$^2$scmHg or less.

Example 11

A titanium oxide film as an insulating inorganic oxide layer with a thickness of 0.01 μm was laminated by sputtering over the entire substrate provided with the fluorescent layers A and B, which was prepared in Example 6, while heating the substrate at 160° C. Then, a solid film of ITO with a thickness of 0.12 μm and a surface resistance of 20 Ω/□ was formed on the substrate using a sputtering apparatus, while the substrate was heated at 160° C.

Then, the ITO was patterned and an organic EL device was formed under the same conditions as in Example 6 to prepare a multi-color light emission apparatus composed of the organic EL device shown in FIG. 9. This multi-color light emission apparatus was allowed to emit light to obtain the same luminance and chromaticity coordinates as in those in Example 6. When the multi-color light emission apparatus was allowed to stand under a nitrogen stream for two weeks, the multi-color light emission apparatus maintained uniform light emission with almost no changes in luminance and chromaticity coordinates and also with few dark spots appearing as deterioration of the device progressed. Also, the angle of view defined by the range in which leakage of light (mono-chromatic light) emitted from the organic electroluminescence device was not confirmed was ±90°, which was a practical level.

The water content of the titanium oxide film with a thickness of 0.01 μm was 0.1% by weight or less and the gas permeability of the titanium oxide film for aqueous vapor and for oxygen was $10^{-13}$ cccm/cm²scmHg or less.

Example 12

A photocurable transparent adhesive of a methacrylate type oligomer (3102, manufactured by 3-Bond corp.) was applied, by casting, to the substrate prepared in Example 6, in which the protective layer was laminated on the fluorescent layers A and B. The glass surface of a glass substrate (soda-lime glass) of 100 mm×100 mm×50 μm thickness as an insulating inorganic oxide layer on which a titanium oxide film with a thickness of 0.05 μm and a film of a transparent electrode of ITO (anode) with a thickness of 0.12 μm were completely formed in order was applied to the substrate. The substrate was irradiated with UV rays through the surface of the ITO at a dose of 3,000 mJ/cm² (365 nm), followed by baking at 80° C.

Then, the ITO was patterned and an organic EL device was formed under the same conditions as in Example 6 to prepare a multi-color light emission apparatus composed of the organic EL device shown in FIG. 14. This multi-color light emission apparatus was allowed to emit light to obtain the same luminance and chromaticity coordinate as in those in Example 6. When the multi-color light emission apparatus was allowed to stand under a nitrogen stream for two weeks, the multi-color light emission apparatus maintained uniform light emission with almost no changes in luminance and chromaticity coordinate and also with few dark spots appearing as deterioration of the device progressed. Also, the angle of view defined by the range in which leakage of light (mono-chromatic light) emitted from the organic electroluminescence device was not confirmed was ±60°, which was a practical level.

The water content of the glass substrate with a thickness of 50 μm, on which the titanium oxide film with a thickness of 0.01 μm was formed, in this example, was 0.1% by weight or less and the gas permeability of the glass substrate, on which titanium oxide film was formed, for aqueous vapor and for oxygen was $10^{-13}$ cccm/cm² scmHg or less.

Comparative Example 3 (in the case of no provision for the inorganic oxide layer)

A methacrylate type photocurable resin (V259PA, manufactured by Nippon Steel Chemical Co., Ltd.) was applied, by spin-coating, to the substrate provided with the fluorescent layers A and B, which was prepared in Example 6. After baking at 80° C., the substrate was irradiated with UV light at a dose of 300 mJ/cm² (365 nm). Then, the substrate was baked at 160° C. to laminate a transparent protective layer with a thickness of 5 μm.

Next, a film of ITO (anode) with a thickness of 0.12 μm and a surface resistance of 20 Ω/□ was formed on the substrate using a sputtering apparatus, while the substrate was heated at 160° C.

Figure 15:
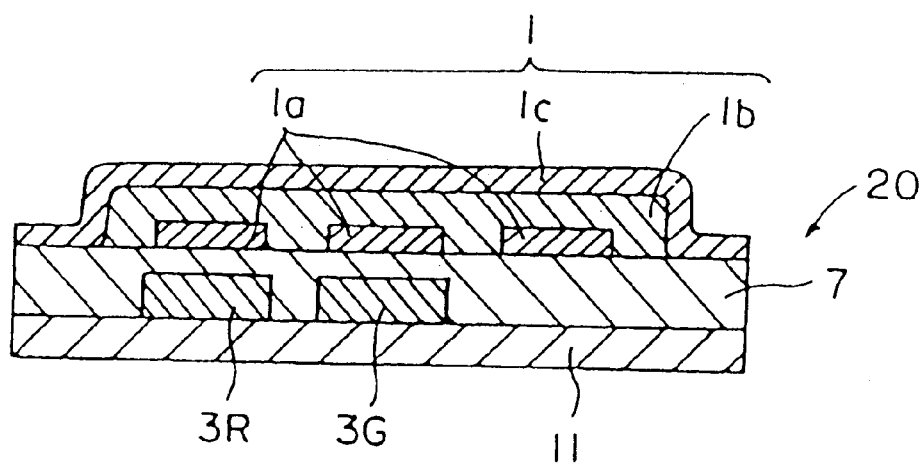
FIG. 15 is a schematic and typical cross section of an example of a conventional multi-color light emission apparatus.

Then, the ITO was patterned and an organic EL device was formed under the same conditions as in Example 6 to prepare a multi-color light emission apparatus composed of the organic EL device shown in FIG. 15. This multi-color light emission apparatus was allowed to emit light to obtain the same luminance and chromaticity as in those in Example 6. However, when the multi-color light emission apparatus was allowed to stand under a nitrogen stream for two weeks, the luminance viewed from the portion lacking the fluorescent layer under the same conditions as in Example 6 decreased to 5 cd/cm² and many dark points as deterioration of the device progressed, exhibiting a clear problem.

The total content of water contained in the protective layer was 1.2% by weight and the gas permeability of the protective layer for aqueous vapor and for oxygen was $10^{-13}$ cccm/cm²scmHg or more.

Comparative Example 4 (in the case where the thickness of the inorganic oxide layer was 0.005 μm)

A methacrylate type photocurable resin (V259PA, manufactured byNippon Steel Chemical Co., Ltd.) was applied, by spin-coating, to the substrate provided with the fluorescent layers A and B, which was prepared in Example 6. After baking at 80° C., the substrate was irradiated with UV light at a dose of 300 mJ/cm² (365 nm). Then, the substrate was baked at 160° C. to laminate a transparent protective film with a thickness of 5 μm.

Next, using a sputtering apparatus, a silicon oxide film as an insulating inorganic oxide layer with a thickness of 0.005 μm was laminated over the entire substrate heated at 160° C. and a solid film of ITO with a thickness of 0.12 μm and a surface resistance of 20 Ω/□ was formed over the entire substrate using a sputtering apparatus, while the substrate was heated at 160° C.

Then, the ITO was patterned and an organic EL device was formed under the same conditions as in Example 6 to prepare a multi-color light emission apparatus composed of the organic EL device. This multi-color light emission apparatus was allowed to emit light to obtain the same luminance and chromaticity as in Example 6. However, when the multi-color light emission apparatus was allowed to stand under a nitrogen stream for two weeks, the luminance viewed from the portion lacking the fluorescent layer under the same conditions as in Example 6 decreased to 20 cd/cm² and many dark spots as deterioration of the device progressed, exhibiting a clear problem.

The water content of the silicon oxide film with a thickness of 0.005 μm was 0.1% by weight or less. However, the gas permeability of the silicon oxide film with a thickness of 0.005 μm for aqueous vapor and for oxygen was $10^{-13}$ cccm/cm²scmHg or more.

Comparative Example 5 (in the case where the thickness of the inorganic oxide layer (plate glass) was 300 μm)

The glass surface of a glass plate (borosilicate glass) of 100 mm×100 mm×300 μm thickness as an insulating inorganic oxide layer on which a solid film of ITO (anode) with a thickness of 0.12 μm and a surface resistance of 20 Ω/□ was formed was applied to the substrate prepared in Example 6, on which the patterns of the fluorescent layers A and B, the protective layer, and the adhesive layer were subsequently laminated. The substrate was irradiated with UV rays through the ITO surface at a dose of 3,000 mJ/cm² (365 nm), followed by baking at 80° C.

Then, the ITO was patterned and an organic EL device was formed under the same conditions as in Example 6 to prepare a multi-color light emission apparatus composed of the organic EL device. This multi-color light emission apparatus was allowed to emit light to obtain the same luminance and chromaticity as in Example 6. When the multi-color light emission apparatus was allowed to stand under a nitrogen stream for two weeks, the multi-color light emission apparatus maintained uniform light emission with almost no changes in luminance and chromaticity coordinates and also with few dark points appearing with the progress in deterioration of the device. However, the angle of view defined by the range in which leakage of light (mono-chromatic light) emitted from the organic EL device was not confirmed was ±30°. There were portions (angles) where light of a color differing from the emitted color was viewed in a normal sight range, exhibiting a practical problem.

Comparative Example 6 (in the case of forming the protective layer (flat layer) using a sol-gel glass method)

The substrate produced in Example 6, which was provided with the patterns of the fluorescent layers A and B, was dipped into a mixed solution consisting of 10% by weight of tetraethoxysilane ($Si(OC_2H_5)_4$) and water/ethanol (ratio by volume: 1:2) containing 1% by weight of hydrochloric acid.

The substrate was slowly lifted to produce a substrate in which the fluorescent layers A and B were dip-coated with silicon oxide ($SiO_2$) sol.

The substrate was then heated at 400° C. so that silicon oxide was allowed to gel and thereby a glass-like protective layer was laminated on the fluorescent layers A and B. However, it was confirmed that the patterns of the fluorescent layers A and B were blackened (carbonized) to show deterioration in these layers.

Because of this, the substrate was heated at 160° C. so that silicon oxide was allowed to gel and thereby a glass-like protective layer with a thickness of 0.2 $\mu$m was laminated on the fluorescent layers A and B.

Next, a film of ITO (anode) with a thickness of 0.12 $\mu$m and a surface resistance of 20 $\Omega/\square$ was formed on the entire substrate using a sputtering apparatus, while the substrate was heated at 160° C.

Then, the ITO was patterned and an organic EL device was formed under the same conditions as in Example 6 to provide a multi-color light emission apparatus composed of the organic EL device shown in FIG. 15. This multi-color light emission apparatus was allowed to emit light to obtain the same luminance and chromaticity as in Example 6. However, when the multi-color light emission apparatus was allowed to stand under a nitrogen stream for two weeks, the luminance viewed from the portion lacking the fluorescent layer under the same conditions as in Example 6 decreased to 5 cd/cm$^2$ and many dark spots appeared as deterioration of the device progressed, exhibiting a clear problem.

The water content contained in the sol-gel silicon oxide film with a thickness of 0.2 $\mu$m was 1.5% by weight. Also, the gas permeability of the sol-gel silicon oxide film to aqueous vapor and to oxygen was $10^{-13}$ cccm/cm$^2$scmHg or more, showing that the protective layer produced by the sol-gel method was inappropriate.

INDUSTRIAL APPLICABILITY

As is clear from the above explanations, the present invention can provide a multi-color light emission apparatus using an organic EL device having an excellent light emission life and excellent characteristics in the angle of view. Also, the present invention can provide a process for manufacturing the multi-color light emission apparatus in a stable and efficient manner.

Accordingly, the present invention can be preferably applied for thin type multi-color or full color displays of various emission types.

What is claimed is:

1. A multi-color light emission apparatus comprising a support substrate, an organic electroluminescence (EL) device disposed on the support substrate, and a fluorescent layer disposed to correspond to a transparent electrode or electrode of the organic EL device to absorb the light emitted from the organic EL device and to emit visible fluorescent light, wherein a transparent inorganic oxide substrate on which the fluorescent layer is placed is disposed between the organic EL device and the fluorescent layer in such a manner as to provide a gap between the fluorescent layer and the organic EL device, and the organic EL device is sealed using a sealing means between the transparent inorganic oxide substrate and the support substrate.

2. The multi-color light emission apparatus according to claim 1, wherein the fluorescent layer is separately disposed on the transparent inorganic oxide substrate on the same plane.

3. The multi-color light emission apparatus according to claim 1 or 2, wherein at least a transparent protective layer of the fluorescent layer and a transparent substrate are farther disposed on the fluorescent layer.

4. The multi-color light emission apparatus according to claim 1, wherein the thickness of the transparent inorganic oxide substrate is in a range of from 1 to 200 $\mu$m.

5. The multi-color light emission apparatus according to claim 1, wherein the transparent inorganic oxide substrate is made of a transparent glass plate.

6. A multi-color light emission apparatus comprising a transparent support substrate, fluorescent layers separately disposed on the transparent support substrate on the same plane, and an organic electroluminescence (EL) device disposed on or above the fluorescent layers, the fluorescent layers being disposed to correspond to a transparent electrode or electrode of the organic EL device so that each of the fluorescent layers absorbs the light emitted from the organic EL device and emits different visible fluorescent light, wherein a transparent and insulating inorganic oxide layer with a thickness of from 0.01 to 200 $\mu$m is interposed between the fluorescent layer and the organic EL device wherein at least a transparent protective layer of the fluorescent layers and a transparent adhesive layer are disposed between the fluorescent layers and the transparent and insulating inorganic oxide layer.

7. The multi-color light emission apparatus according to claim 6, wherein the transparent and insulating inorganic oxide layer is made of a transparent and insulating glass plate.

8. The multi-color light emission apparatus according to claim 6, wherein the transparent inorganic oxide layer is made from one or more compounds selected from a group consisting of silicon oxide, aluminum oxide, and titanium oxide.

9. The multi-color light emission apparatus according to claim 6, wherein the transparent and insulating inorganic oxide layer is produced by forming a film of one or more compounds selected from a group consisting of silicon oxide, aluminum oxide, and titanium oxide on at least one of the surface or back face of a transparent and insulating glass plate.

10. The multi-color light emission apparatus according to claim 6, wherein the transparent and insulating inorganic layer contains mainly an inorganic oxide.

* * * * *